(12) United States Patent
Tang

(10) Patent No.: US 8,254,173 B2
(45) Date of Patent: Aug. 28, 2012

(54) NAND MEMORY CONSTRUCTIONS

(75) Inventor: Sanh D. Tang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 163 days.

(21) Appl. No.: 12/872,803

(22) Filed: Aug. 31, 2010

(65) Prior Publication Data

US 2012/0049264 A1 Mar. 1, 2012

(51) Int. Cl.
*G11C 11/412* (2006.01)
*G11C 11/418* (2006.01)
*G11C 11/419* (2006.01)
*H01L 29/788* (2006.01)
*H01L 29/792* (2006.01)

(52) U.S. Cl. ............... 365/185.17; 257/314; 257/E29.3; 257/E29.309

(58) Field of Classification Search ............. 365/185.17; 257/314, E29.3, E29.309
See application file for complete search history.

(56) References Cited

U.S. PATENT DOCUMENTS

| | | | |
|---|---|---|---|
| 5,840,591 A | 11/1998 | Park et al. | |
| 6,218,236 B1 | 4/2001 | Economikos et al. | |
| 6,689,660 B1 | 2/2004 | Noble et al. | |
| 7,282,762 B2 | 10/2007 | Forbes | |
| 7,332,773 B2 | 2/2008 | Forbes | |
| 7,369,436 B2 | 5/2008 | Forbes | |
| 7,642,160 B2 * | 1/2010 | Mokhlesi | 438/259 |
| 7,687,842 B2 | 3/2010 | Kakoschke et al. | |
| 7,768,073 B2 | 8/2010 | Wells | |
| 7,800,161 B2 * | 9/2010 | Mokhlesi | 257/319 |
| 2006/0033145 A1 | 2/2006 | Kakoschke et al. | |
| 2009/0251968 A1 | 10/2009 | Kleint et al. | |

* cited by examiner

*Primary Examiner* — Evan Pert
(74) *Attorney, Agent, or Firm* — Wells St. John P.S.

(57) ABSTRACT

Some embodiments include NAND memory constructions. The constructions may contain semiconductor material pillars extending upwardly between dielectric regions, with individual pillars having a pair of opposing vertically-extending sides along a cross-section. First conductivity type regions may be along first sides of the pillars, and second conductivity type regions may be along second sides of the individual pillars; with the second conductivity type regions contacting interconnect lines. Vertical NAND strings may be over the pillars, and select devices may selectively couple the NAND strings with the interconnect lines. The select devices may have vertical channels directly against the semiconductor material pillars and directly against upper regions of the first and second conductivity type regions. Some embodiments include methods of forming NAND memory constructions.

17 Claims, 27 Drawing Sheets

NAND MEMORY CONSTRUCTIONS

TECHNICAL FIELD

NAND memory constructions and methods of forming NAND memory constructions.

BACKGROUND

Memory devices provide data storage for electronic systems. One type of memory is a non-volatile memory known as flash memory. Many modern personal computers have BIOS stored on a flash memory chip. Such BIOS is sometimes called flash BIOS. Flash memory is also popular in wireless electronic devices because it enables the manufacturer to support new communication protocols as they become standardized, and to provide the ability to remotely upgrade the devices for enhanced features.

NAND is a basic architecture of flash memory. A NAND cell unit comprises at least one select gate coupled in series to a serial combination of memory cells (with the serial combination being commonly referred to as a NAND string). NAND is often formed as a memory array having a large number of memory cells arranged in row and column fashion.

Individual memory cells of a NAND array may be uniquely addressed during programming and erasing operations. However, in some applications it may be desired to deprogram (i.e., erase) all of the cells in the array. The cells may be grouped into blocks in such applications, and the NAND array may be erased by serially stepping through the individual blocks to erase the blocks one after another. It would be desirable to develop architectures which enable all of the memory cells of a NAND array to be erased in a single global operation instead of the conventional block erase operations.

DETAILED DESCRIPTION OF THE ILLUSTRATED EMBODIMENTS

Figure 1:
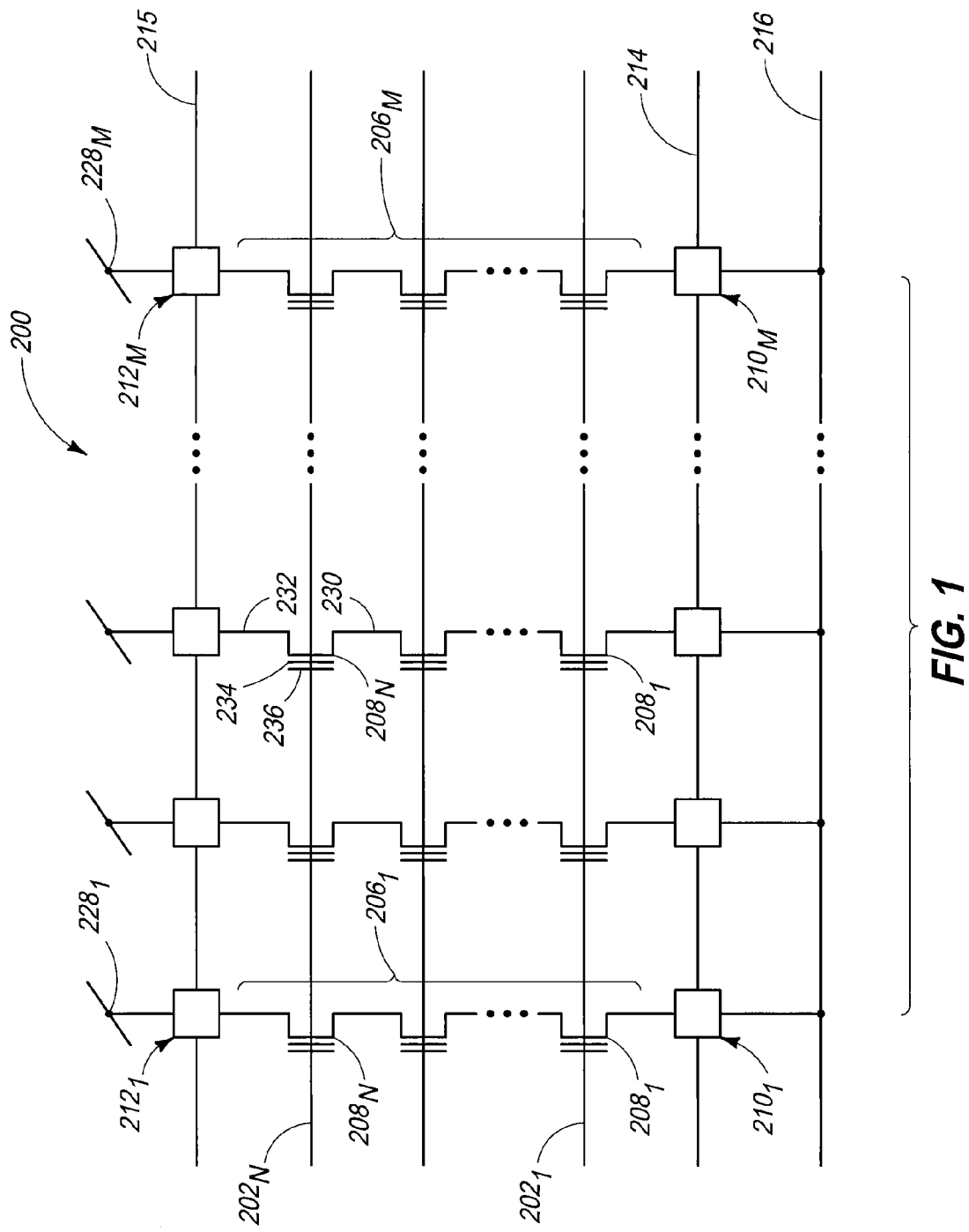
FIG. 1 is a schematic of a NAND memory array in accordance with an embodiment.

Some embodiments pertain to new NAND memory array architectures. Before discussing specific aspects of such new architectures, it is useful to discuss some generalities about NAND memory arrays. Such generalities are described with reference to a NAND memory array 200 shown in FIG. 1.

Memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material to store charge, or may use charge-trapping material (such as, for example, metallic nanodots) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source to drain between a source select device 210 and a drain select device 212. Each source select device 210 is located at an intersection of a string 206 and a source select line 214, while each drain select device 212 is located at an intersection of a string 206 and a drain select line 215. The select devices 210 and 212 may be any suitable access devices, and are generically illustrated with boxes in FIG. 1.

A source of each source select device 210 is connected to a common source line 216. The drain of each source select device 210 is connected to the source of the first charge-storage transistor 208 of the corresponding NAND string 206. For example, the drain of source select device $210_1$ is connected to the source of charge-storage transistor $208_1$ of the corresponding NAND string $206_1$. The source select devices 210 are connected to source select line 214.

The drain of each drain select device 212 is connected to a bitline 228 at a drain contact. For example, the drain of drain select device $212_1$ is connected to the bitline $228_1$. The source of each drain select device 212 is connected to the drain of the last charge-storage transistor 208 of the corresponding NAND string 206. For example, the source of drain select device $212_1$ is connected to the drain of charge-storage transistor $208_N$ of the corresponding NAND string $206_1$.

Any suitable source and drain select devices (210 and 212) may be utilized in various embodiments, with example select devices being described below with reference to FIGS. 2 and 3.

Referring still to FIG. 1, charge-storage transistors 208 include a source 230, a drain 232, a charge storage region 234, and a control gate 236. Charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

Some embodiments pertain to NAND memory arrays in which the channel regions of select devices are all tied to a bulk semiconductor material. This can enable all of the memory cells of the NAND array to be simultaneously erased, or in other words, can enable a global erase of a NAND memory array.

An example embodiment architecture is described with reference to a semiconductor construction 10 in FIG. 2. The construction 10 comprises a semiconductor material 12. Semiconductor material 12 may comprise, consist essentially of, or consist of monocrystalline silicon, and may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. In some embodiments material 12 may be bulk semiconductor material of a semiconductor wafer; such as, for example, bulk silicon of a monocrystalline silicon wafer. The material 12 may be lightly background doped (e.g., doped to a dopant concentration of less than or equal to about $1\times10^{16}$ atoms/cm$^3$) with appropriate dopant (for instance, with p-type dopant, such as boron).

Semiconductor material 12 is configured to comprise a base 14 and a plurality of pillars 16, 18, 20 and 22 extending upwardly from such base. The pillars have top surfaces 15, and in the shown embodiment such surfaces are substantially planar. Valleys 24, 26 and 28 are between the pillars.

A dielectric material 30 is within the valleys 24, 26 and 28. The dielectric material may comprise any suitable composition or combination of compositions, and in some embodiments may comprise, consist essentially of, or consist of silicon dioxide. Although material 30 is shown to be homogeneous, in some applications the material may comprise two or more discrete layers. It can be advantageous to avoid utilization of silicon nitride as a dielectric material in NAND architecture due to the charge-trapping characteristics of silicon nitride. However, there may be applications in which dielectric material 30 comprises silicon nitride.

In the shown embodiment a dielectric spacer 32 is within each of the valleys 24, 26 and 28, and adjacent dielectric material 30. The spacer is utilized for processing discussed below with reference to FIGS. 7 and 8, and may comprise any suitable dielectric composition. In some embodiments the spacers 32 may comprise the same composition as dielectric material 30, and accordingly the spacers 32 and material 30 may merge to form a single dielectric material within the valleys. In other embodiments the spacers may be a different composition from material 30 so that the spacers are compositionally distinguishable from material 30. The dielectric material 30 and spacers 32 may be considered together as dielectric regions 31, 33 and 35 that fill the respective valleys 24, 26 and 28.

Figure 2:
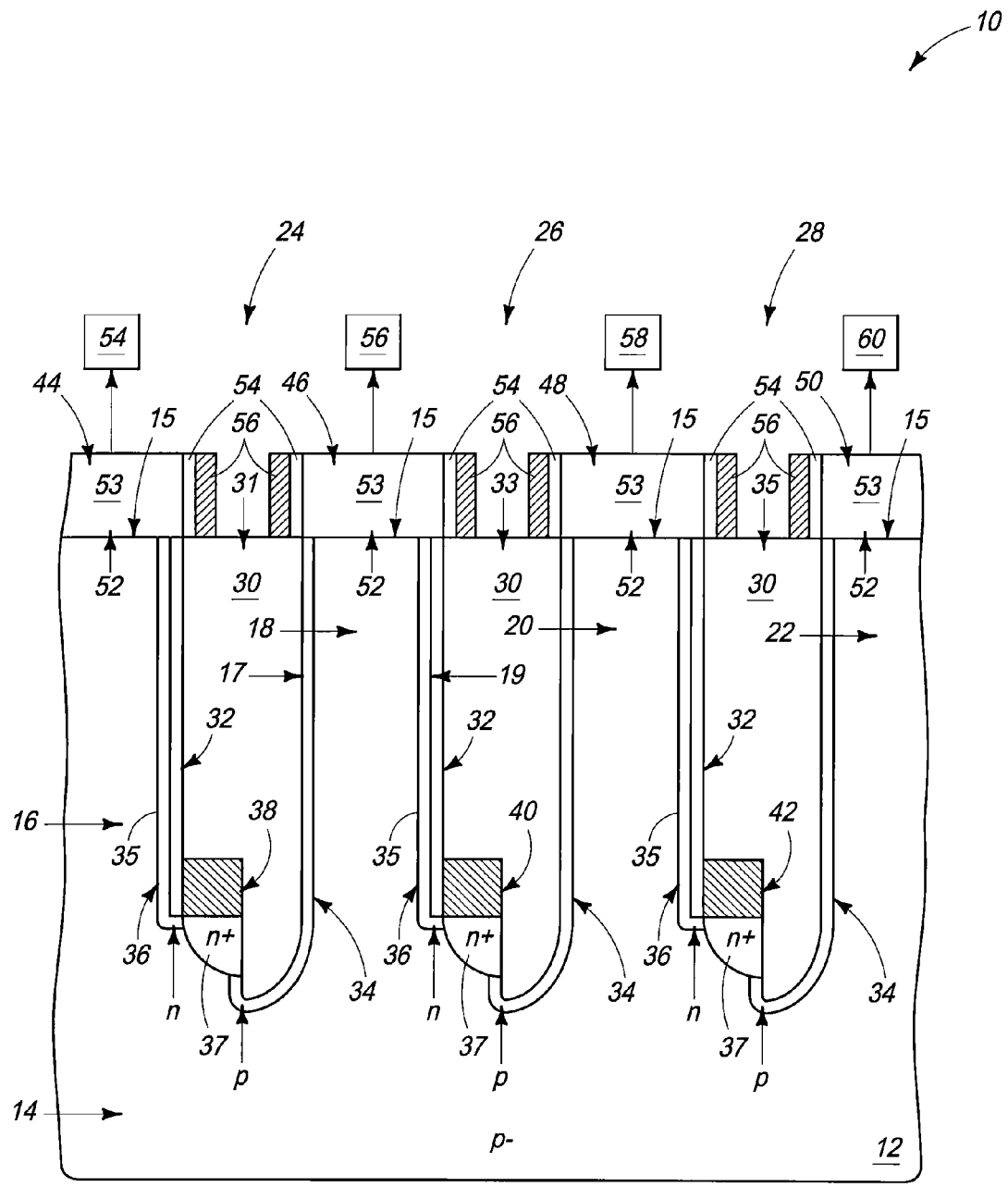
FIG. 2 is a diagrammatic cross-sectional view of a portion of a semiconductor construction illustrating an example embodiment NAND memory construction.

The pillars 16, 18, 20 and 22 have vertically-extending sides along the plane of the cross-sectional view of FIG. 2. For instance, pillar 18 is shown to have opposing vertically-extending sides 17 and 19. The opposing sides of the pillars may be referred to as a first side and a second side to distinguish them from one another; and in the shown embodiment side 17 be referred to as a first side, while side 19 is referred to as a second side. P-type diffusion regions 34 are along the first sides (for instance, the first side 17 of the pillar 18), and n-type diffusion regions 36 are along the second sides of the pillars (for instance, the second side 19 of pillar 18).

The p-type doped regions 34 correspond to single segments extending partially around the dielectric regions 31, 33 and 35, and to the tops 15 of the pillars 16, 18, 20 and 22. Such segments are doped to a concentration (p). In contrast, the n-type doped regions 36 each comprise two segments 35 and 37; with the segments 37 being doped to concentrations (n+) and the segments 35 being doped to concentrations (n). The segments 37 are near the bottoms of the valleys 24, 26 and 28, and the segments 35 extend from the segments 37 to the tops 15 of the pillars 16, 18, 20 and 22.

The p-type doped regions 34 and n-type doped regions 36 are directly against dielectric regions 31, 33 and 35. In some embodiments the dielectric regions may be considered to have a first portion directly against one of the doped regions 34 and 36, and a second portion directly against the other of the doped regions 34 and 36. The p-type doped regions 34 are electrically connected to p-type base 12 (which may be a p-well in some embodiments).

Electrically conductive interconnect lines 38, 40 and 42 are within the valleys 24, 26 and 28. Such lines are directly against dielectric material 30, and are also directly against heavily-doped segments 37 of n-type doped regions 36. The interconnect lines 38, 40 and 42 may comprise any suitable electrically conductive compositions or combinations of compositions; and may, for example, comprise one or more of various metals (for instance, copper, titanium, tungsten, etc.), metal-containing compositions (for instance, metal nitrides, metal silicides, etc.), and conductively-doped semiconductor materials (for instance, conductively-doped silicon, conductively-doped germanium, etc.). Although the interconnect lines are shown to be homogeneous materials, in some embodiments the individual interconnect lines may comprise two or more discrete layers.

The interconnect lines extend horizontally in and out of the page relative to the cross-section of FIG. 2, and may correspond to source lines (analogous to lines 216 of FIG. 1) in some embodiments. In such embodiments, the utilization of the buried metal source line 216 may enable lower resistance along the source interconnect than would be accomplished relying on doped regions alone as the source line. The interconnect lines may be referred to as extending "primarily horizontally" to indicate that such interconnect lines may have some minor regions within a memory array where the lines extend other than horizontally even though the lines extend mostly horizontally through the array.

Select devices 44, 46, 48 and 50 are over the pillars 16, 18, 20 and 22, respectively. Each of the select devices comprises a vertical channel region 52 directly against semiconductor material 12 of the pillars. Each of the vertical channel regions has a pair of opposing sidewalls along the plane of the shown cross-section. The select devices also comprise gate dielectric 54 along the vertical sidewalls of the channel regions, and comprise electrically conductive gate lines 56 spaced from the vertical channels by the gate dielectric.

The gate dielectric may comprise any suitable composition or combination of compositions; and in some embodiments may comprise, consist essentially of, or consist of silicon dioxide.

The electrically conductive material of the gate lines may comprise any suitable composition or combination of compositions; and in some embodiments may comprise, consist essentially of, or consist of one or more of various metals, metal-containing substances, and conductively-doped semiconductor materials.

The channel regions 52 comprise semiconductor material 53, which may be threshold voltage doped. In some embodiments the semiconductor material 53 may be monocrystalline (such as, for example, embodiments in which the semiconductor material of the channel regions is epitaxially grown from underlying semiconductor material of the pillars 16, 18, 20 and 22), and in other embodiments the semiconductor material 53 may be polycrystalline and/or amorphous. The semiconductor material of the channel regions may be a same composition as the semiconductor material 12. For instance, the semiconductor material 12 and the semiconductor material 53 may both comprise, consist essentially of or consist of silicon, germanium or silicon/germanium.

Vertical NAND strings 54, 56, 58 and 60 are over select devices 44, 46, 48 and 50.

The vertical channel regions 52 are directly against p-type regions 34 and n-type regions 36, and are between the vertical NAND strings (54, 56, 58 and 60) and the doped regions 34 and 36. In the shown embodiment the construction 10 is configured for current to flow within n-type doped regions 36 as the current is transferred between the interconnects (38, 40 and 42), and the NAND strings (54, 56, 58 and 60). The select devices 44, 46, 48 and 50 may be used to gate the flow of such current, or in other words to selectively couple the NAND strings (54, 56, 58 and 60) to the interconnects (38, 40 and 42). Although the shown embodiment is configured for current to flow through the n-type regions 36 to the interconnects (38, 40 and 42), in other embodiments the p regions and n regions could be reversed so that the current is flowed through p-type regions to the interconnects instead of through n-type regions.

An advantage of the embodiment of FIG. 2 is that all of the select devices are directly connected to the p− base (which may be a p-well in some embodiments), and so all of the memory cells within the NAND strings may be erased in a single global operation. Another advantage is that the channel regions 52 of the select devices are directly against the bulk p-type material 12 (in other words, there is no intervening dielectric material, diode, or other isolation between the channel regions and the p-type material 12), and accordingly the channel regions are not electrically floating relative to the bulk p-type material. This can alleviate or eliminate floating body effects that are problematic in some prior art architectures.

The embodiment of FIG. 2 is but one of many embodiments the may be formed in accordance with the concepts disclosed herein. Another example embodiment is shown in FIG. 3 with reference to a semiconductor construction 10a. Identical numbering will be utilized to describe the embodiment of FIG. 3 as is used above to describe the embodiment of FIG. 2, where appropriate.

The construction 10a includes the semiconductor material 12 configured to comprise the base 14 and the plurality of pillars 16, 18, 20 and 22 extending upwardly from such base. The construction also includes the valleys 24, 26 and 28 between the pillars, and the dielectric material 30 within such valleys. The dielectric material 30 forms dielectric material regions 31, 33 and 35 within the valleys 24, 26 and 28. The material 30 is the only dielectric material of regions 31, 33 and 35, unlike the embodiment of FIG. 2 which also had spacers 32 as part of such dielectric regions.

The pillars 16, 18, 20 and 22 have vertically-extending sides (for instance, the sides 17 and 19 of pillar 18), and have the diffusion regions 34 and 36 along such sides. The p-type diffusion regions 34 are single segments identical to the segments discussed above with reference to FIG. 2. The n-type diffusion regions 36 of FIG. 3 are also single segments, unlike the embodiment of FIG. 2 in which the n-type diffusion regions were composed of two different segments.

Figure 3:
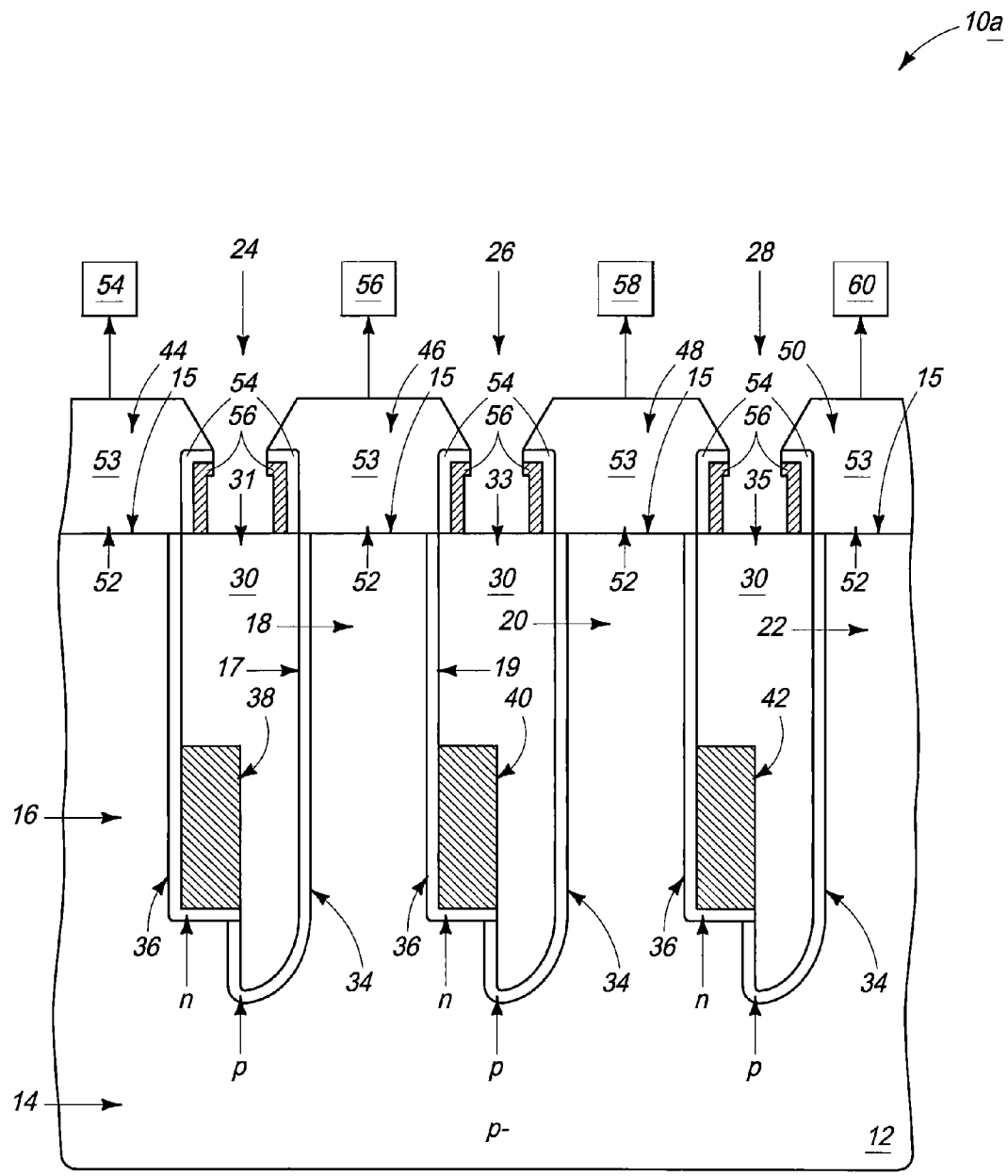
FIG. 3 is a diagrammatic cross-sectional view of a portion of a semiconductor construction illustrating another example embodiment NAND memory construction.

The construction of FIG. 3 includes electrically conductive interconnect lines 38, 40 and 42 within the valleys 24, 26 and 28. Such interconnect lines are directly against dielectric material 30, and are also directly against n-type diffusion regions 36.

The construction of FIG. 3 includes select devices 44, 46, 48 and 50 over the pillars 16, 18, 20 and 22; and includes vertical NAND strings 54, 56, 58 and 60 over the select devices. The select devices of FIG. 3 include vertical channel regions 52, gate dielectric 54, and electrically conductive gate lines 56 analogously to the select devices of FIG. 2. However, unlike the embodiment of FIG. 2, the semiconductor material 53 extends above the gate lines, and in the shown embodiment extends laterally over upper surfaces of the gate lines. In some embodiments the semiconductor material 53 may be epitaxially grown from semiconductor material 12 of the pillars utilizing processing discussed below with reference to FIG. 25.

The embodiments of FIGS. 2 and 3 may be formed utilizing any suitable methods. An example method for forming the embodiment of FIG. 2 is described with reference to FIGS. 4-15.

Figure 4:
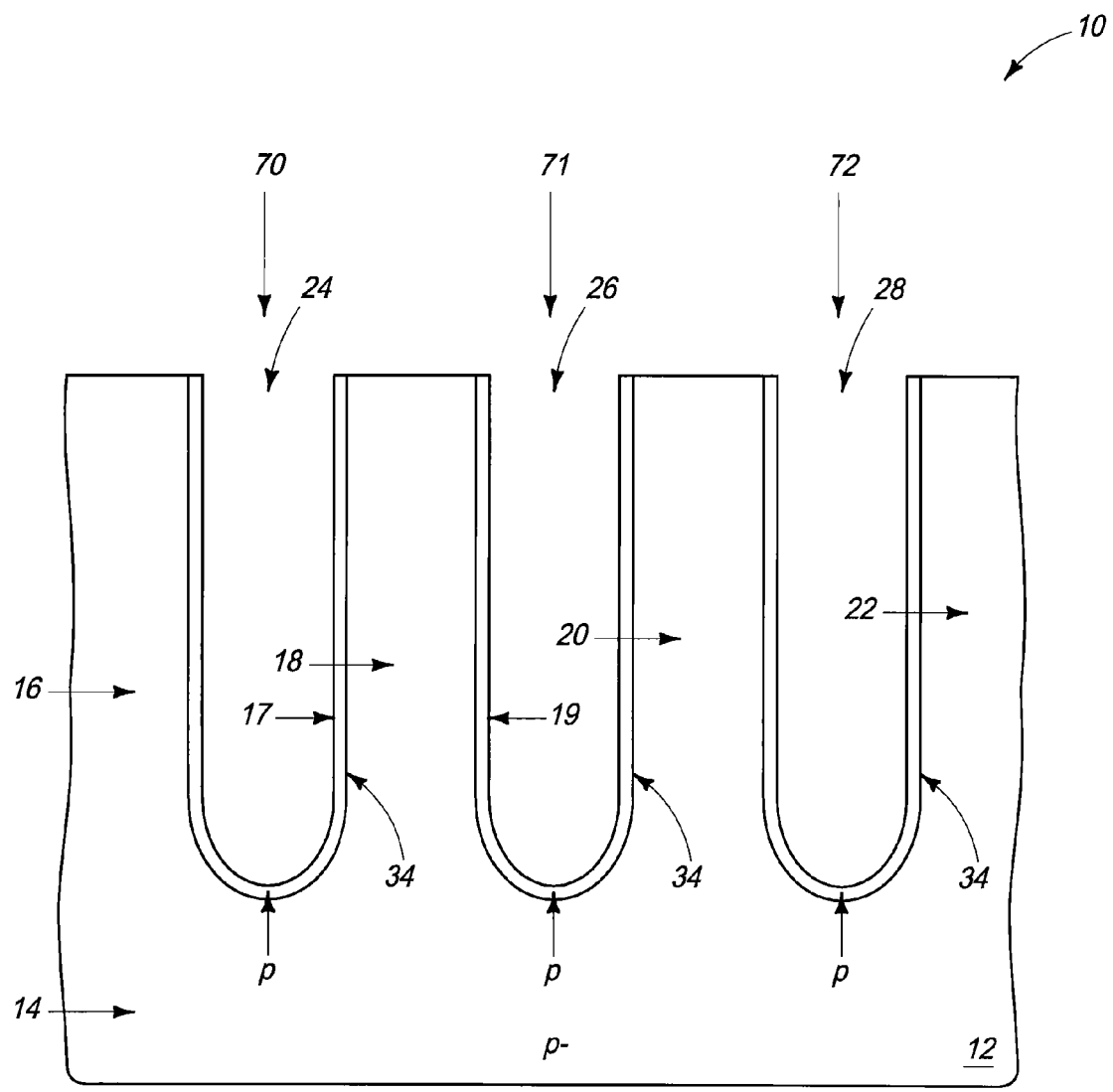
FIGS. 4-11, 13 and 14 are diagrammatic cross-sectional views of a portion of a semiconductor construction illustrating stages of a process sequence for fabrication of a NAND memory construction analogous to that of FIG. 2.

Referring to FIG. 4, construction 10 is shown at a processing stage after a plurality of openings 70-72 are formed into semiconductor material 12. The openings may be formed with any suitable processing. For instance, a photolithographically-patterned mask (not shown) may be formed over an upper surface of material 12 to define locations of openings 70-72, the openings may then be extended into material 12 with one or more suitable etches, and finally the patterned mask may be removed.

After formation of openings 70-72, semiconductor material 12 has a configuration which includes the base 14 and the vertically-extending pillars 16, 18, 20 and 22. Each of the pillars has a pair of opposing vertically-extending sides (for instance, the sides 17 and 19 of pillar 18) along the cross-section of the view of FIG. 4. The opposing sides of an individual pillar may be referred to as a first side and a second side in the discussion that follows.

The openings 70-72 define the valleys 24, 26 and 28 between the pillars.

P-type regions 34 are formed within semiconductor material 12 along the peripheries of the openings 70-72. The p-type regions may be formed by implanting p-type material (for instance, boron) into the semiconductor material. A protective mask (not shown) may be provided over the upper surfaces 15 during implant of the p-type material to form the shown construction in which the p-type regions do not extend across the majority of the area of the upper surfaces 15, and then the protective mask may be subsequently removed. The dopant utilized to form regions 34 may be referred to as a first dopant to distinguish it from other dopants utilized at subsequent processing stages (such as, for example, a dopant utilized at a processing stage discussed below with reference to FIG. 8); and the doped regions 34 may be referred to as first doped regions.

Figure 5:
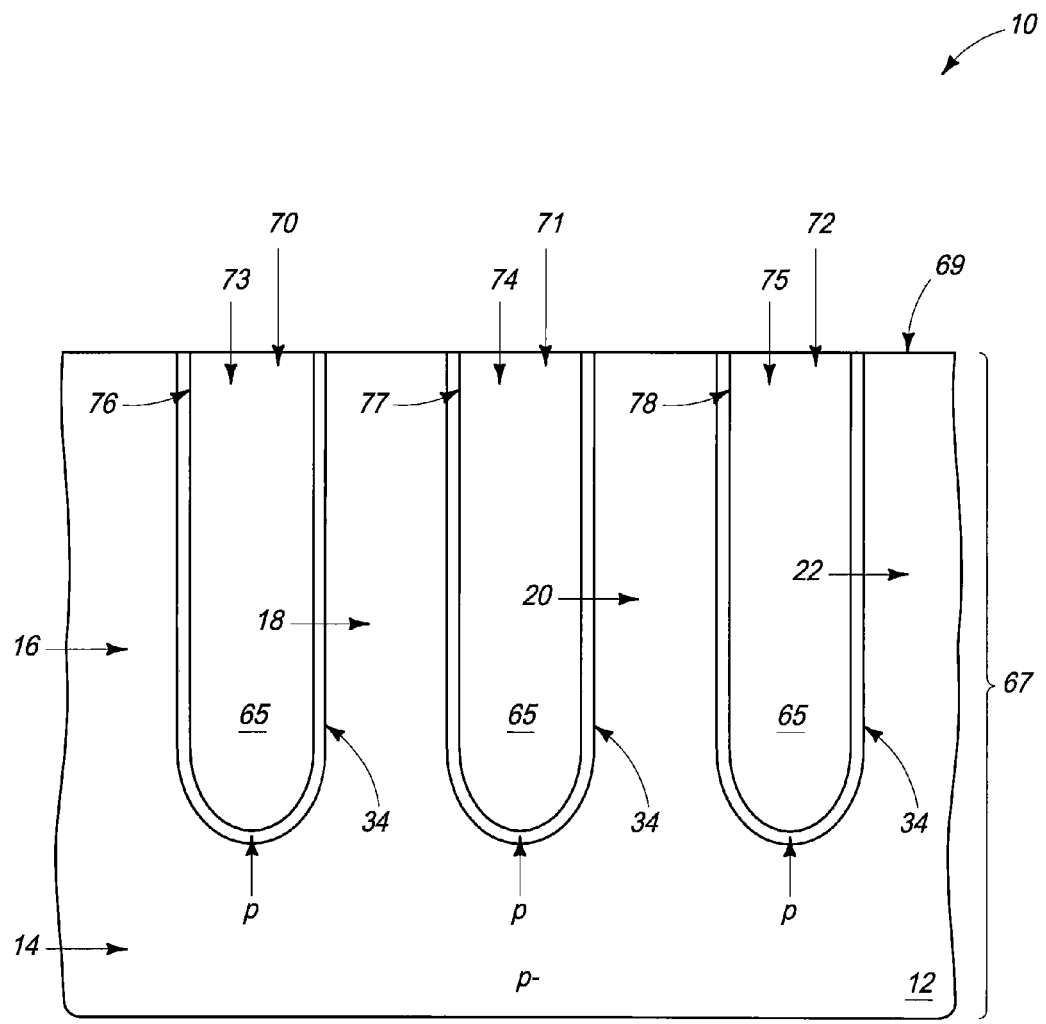

Referring to FIG. 5, dielectric material 65 is formed within openings 70-72. In the shown embodiment a substantially planar surface 69 extends across upper surfaces of the dielectric material 65 and the semiconductor material 12. Such substantially planar surface may be formed by chemical-mechanical polishing (CMP) after filling openings 70-72. Dielectric material 65 may comprise any suitable composition or combination of compositions, and in some embodiments may comprise, consist essentially of, or consist of silicon dioxide.

The dielectric material 65 within openings 70-72 forms dielectric regions 73-75. Each of the dielectric regions may be considered to be paired with an adjacent pillar, with such pairs corresponding to pillar 16/dielectric region 73, pillar 18/dielectric region 74, and pillar 20/dielectric region 75. The pillar/dielectric region pairs comprise pillar/dielectric region interfaces 76-78 where the pillars and dielectric regions are directly adjacent to one another.

The dielectric regions 73-75 and material 12 may be considered to be a substrate 67.

Figure 6:
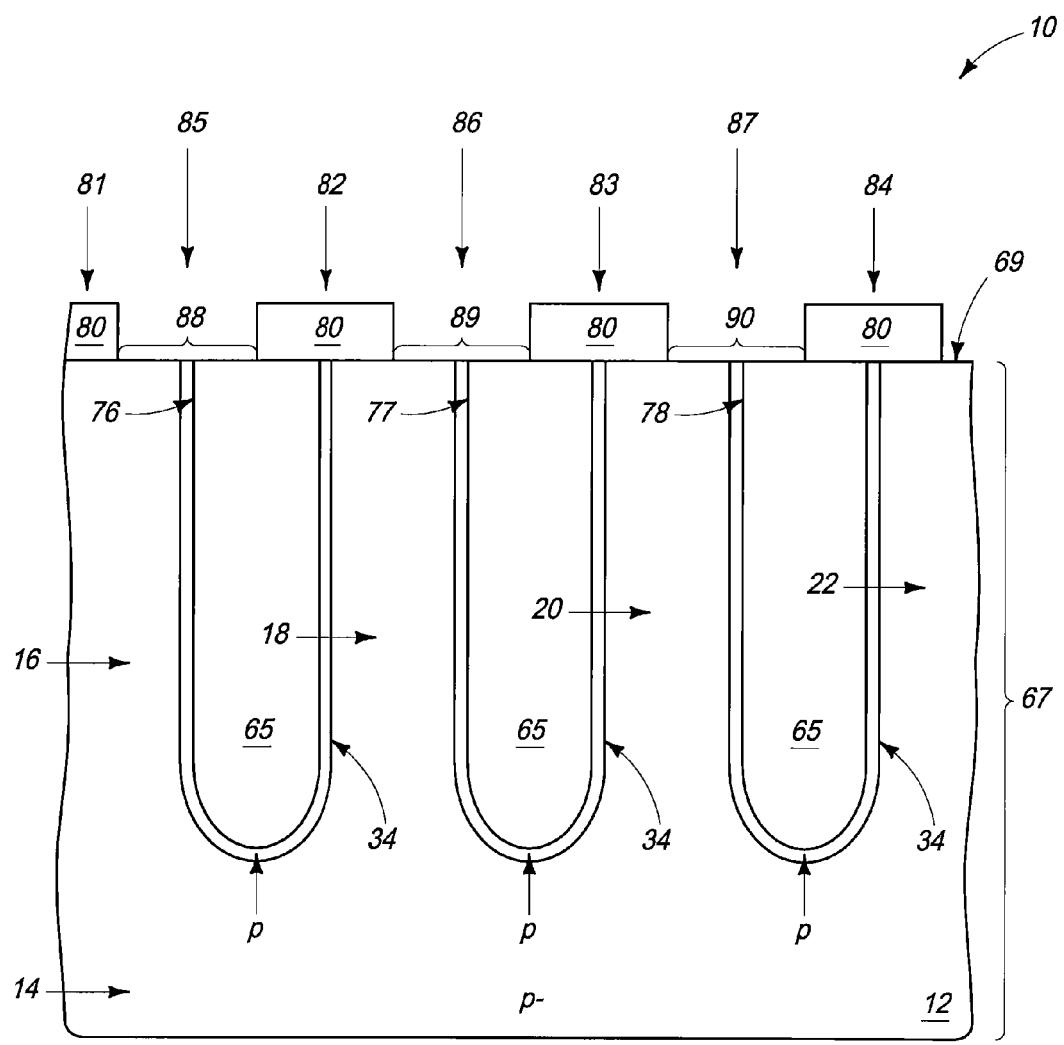

Referring to FIG. 6, a patterned mask of masking material 80 is formed over the surface 69 of substrate 67. The patterned mask comprises a plurality of features 81-84, and comprises gaps 85-87 between the features. Segments 88-90 of substrate 67 are exposed within gaps 85-87, with such segments comprising the pillar/dielectric region interfaces 76-78. Masking material 80 may comprise any suitable composition or combination of compositions. In subsequent processing, materials 12 and 65 are selectively removed relative to masking material 80, and accordingly it can be desired that material 80 comprise a composition to which materials 12 and 65 are selectively etchable. In some embodiments dielectric material 65 comprises low density oxide, and masking material 80 comprises high-density oxide (for instance, oxide formed from such tetraethyl orthosilicate). The materials 12 and 65 are "selectively etchable" relative to material 80 if the materials 12 and 65 etch at a faster rate than material 80, which includes, but is not limited to, applications in which an etch is 100 percent selective for materials 12 and 65 relative to material 80.

Figure 7:
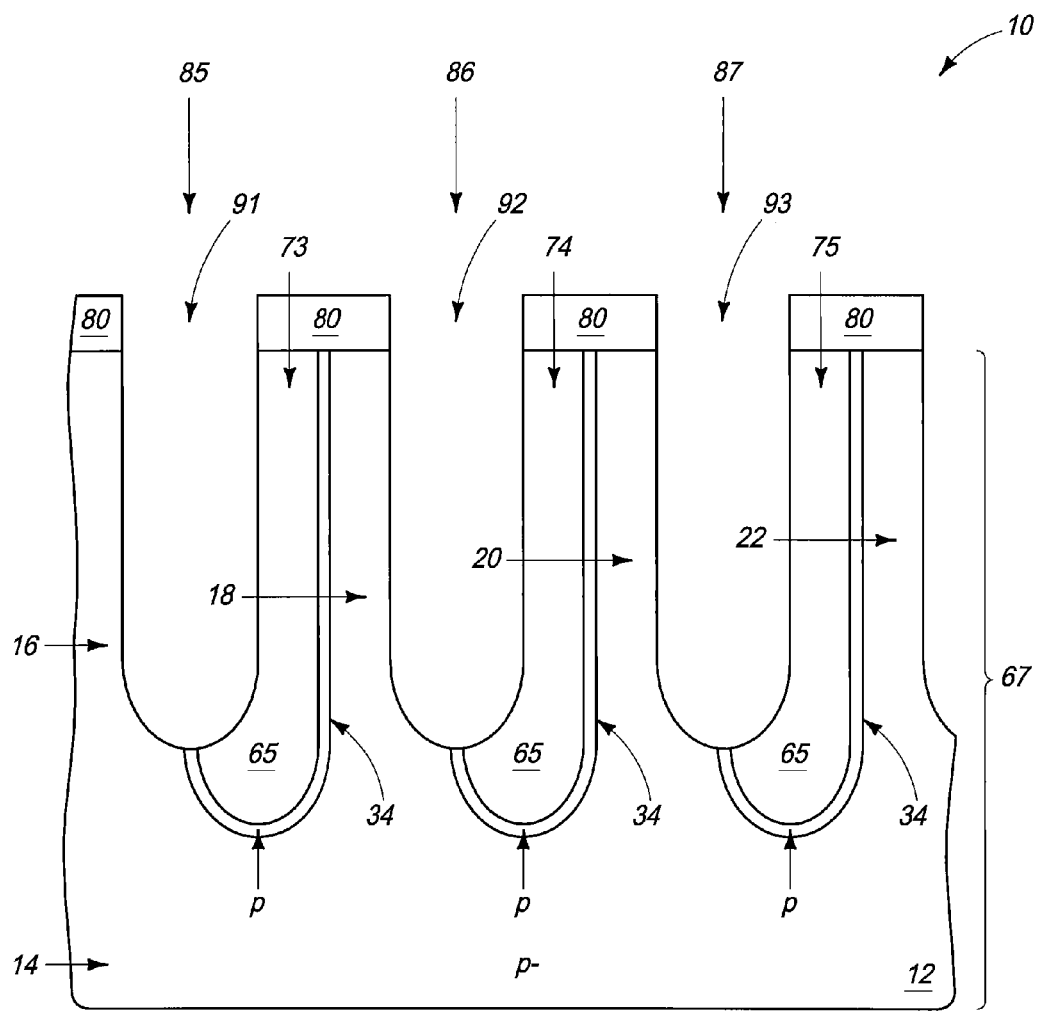

Referring to FIG. 7, gaps 85-87 are extended into materials 12 and 65 with a suitable etch selective for materials 12 and 65 relative to material 80. Such forms receptacles 91-93 at locations previously occupied by pillar/dielectric region interfaces 76-78 (FIG. 6). In the shown embodiment the receptacles 91-93 extend to a depth less than the depth of openings 71-72 (FIG. 4), and accordingly the receptacles do not extend to the bottoms of dielectric regions 73-75.

Figure 8:
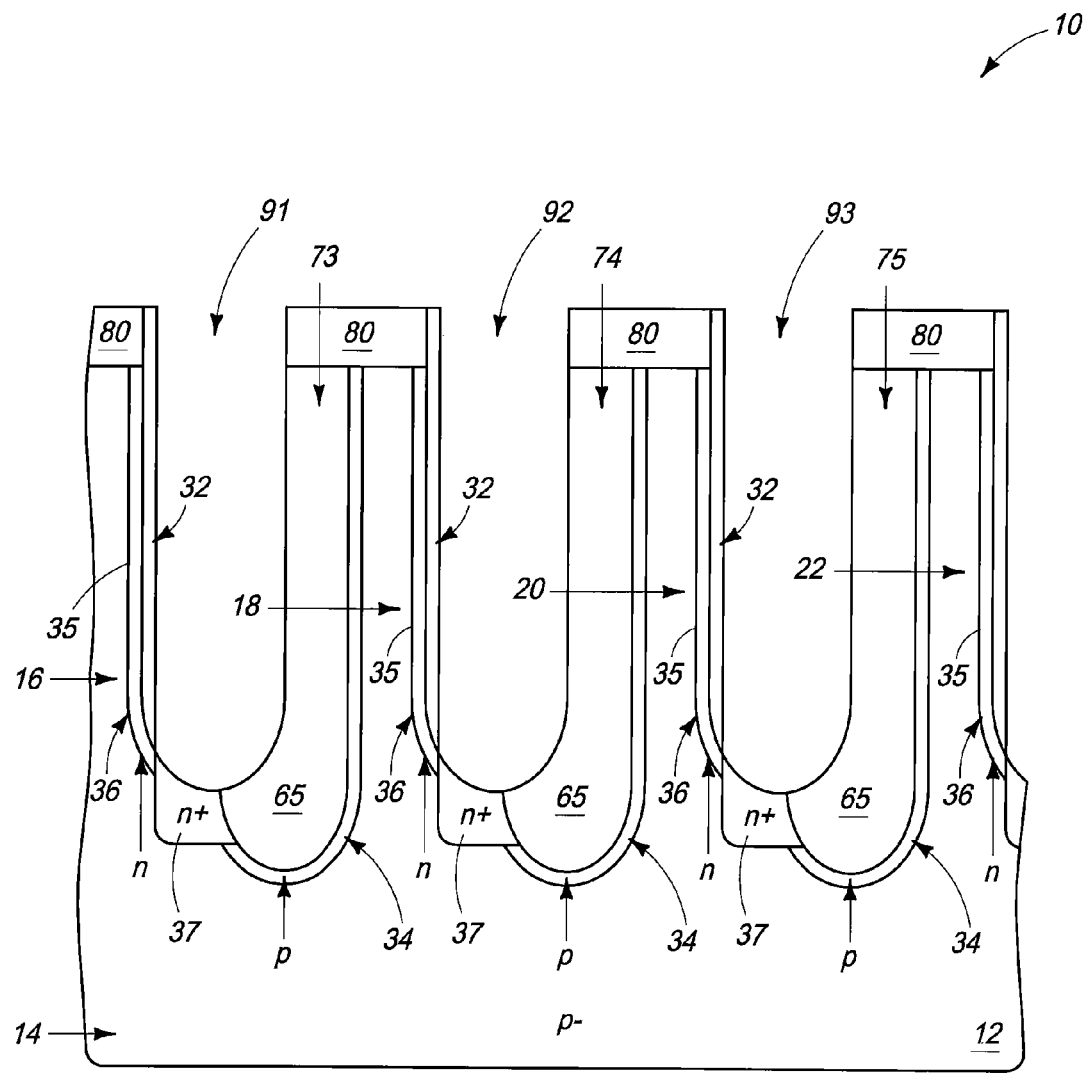

Referring to FIG. 8, n-type dopant is implanted along sidewalls of the receptacles 91-93 to form n-type doped segments 35. Also, dielectric spacers 32 are formed along the sides of the receptacles, and n-type dopant is implanted through the bottoms of the receptacles after forming the spacers 32 to form heavily doped segments 37. The implant utilized to form segments 35 may be an angled implant, and may be conducted before or after forming spacers 32.

Spacers 32 may comprise any suitable composition or combination of compositions, and in some embodiments may comprise oxide identical to the oxide of dielectric material 65.

The segments 35 and 37 together form n-type doped region 36. The n-type dopant may be referred to as a second dopant to distinguish it from the first dopant utilized to form p-type region 34, and the segment 36 may be referred to as a second doped segment. Although regions 34 and 36 are shown to be a p-type region and an n-type region, respectively, in other embodiments the dopant types could be reversed so that the region 34 is n-type and the region 36 is p-type. In such other embodiments, material 12 may be lightly n-type doped rather than being lightly p-type doped; and may correspond to an n-well.

Figure 9:
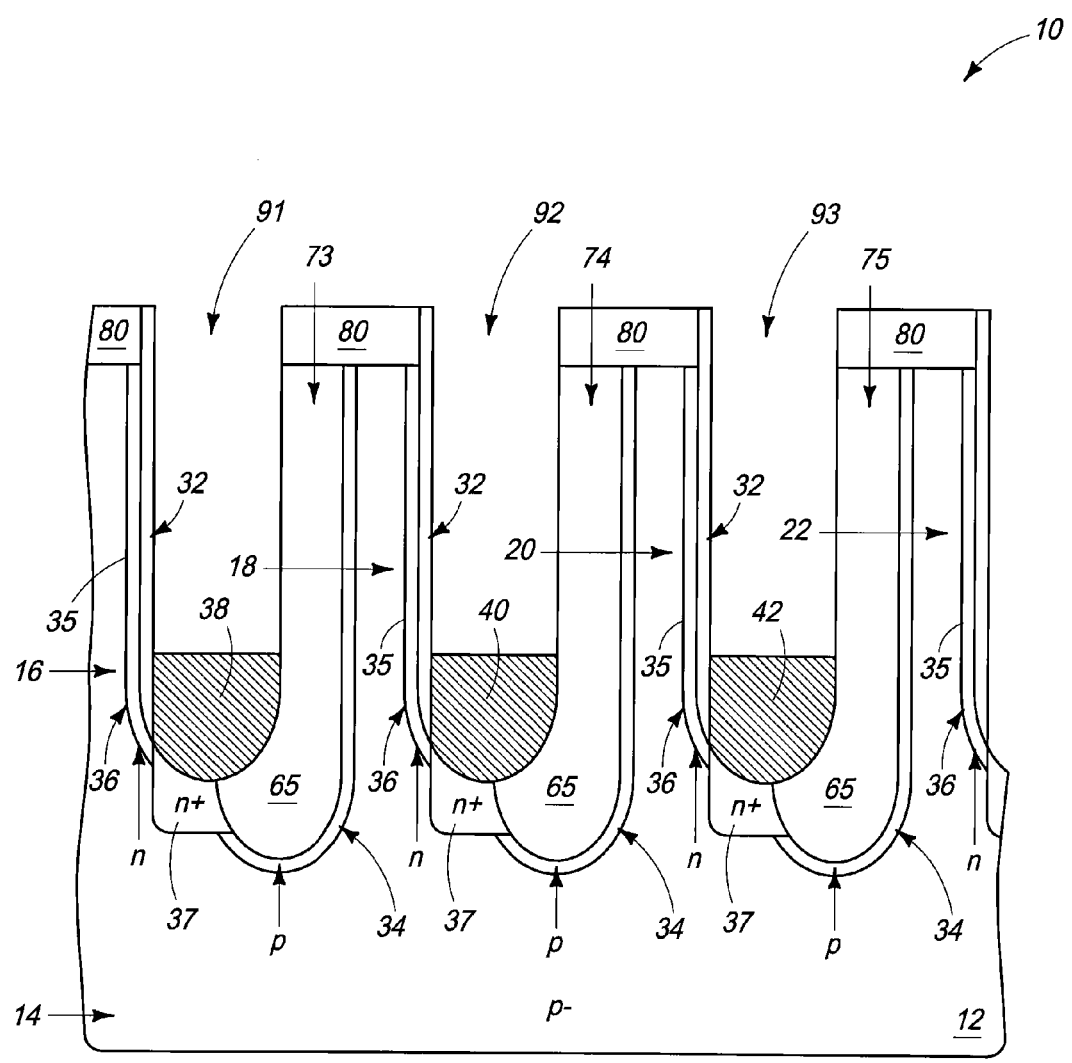

Referring to FIG. 9, electrically conductive interconnect lines 38, 40 and 42 are formed at the bottoms (or bases) of receptacles 91-93. The electrically conductive interconnect lines may be formed with any suitable processing, including, for example, atomic layer deposition (ALD), chemical vapor deposition (CVD) and/or physical vapor deposition (PVD) of suitable electrically conductive material, followed by appropriate patterning of the material. The interconnect lines 38, 40 and 42 extend horizontally along a direction in and out of the page relative to the cross-section of FIG. 9.

Figure 10:
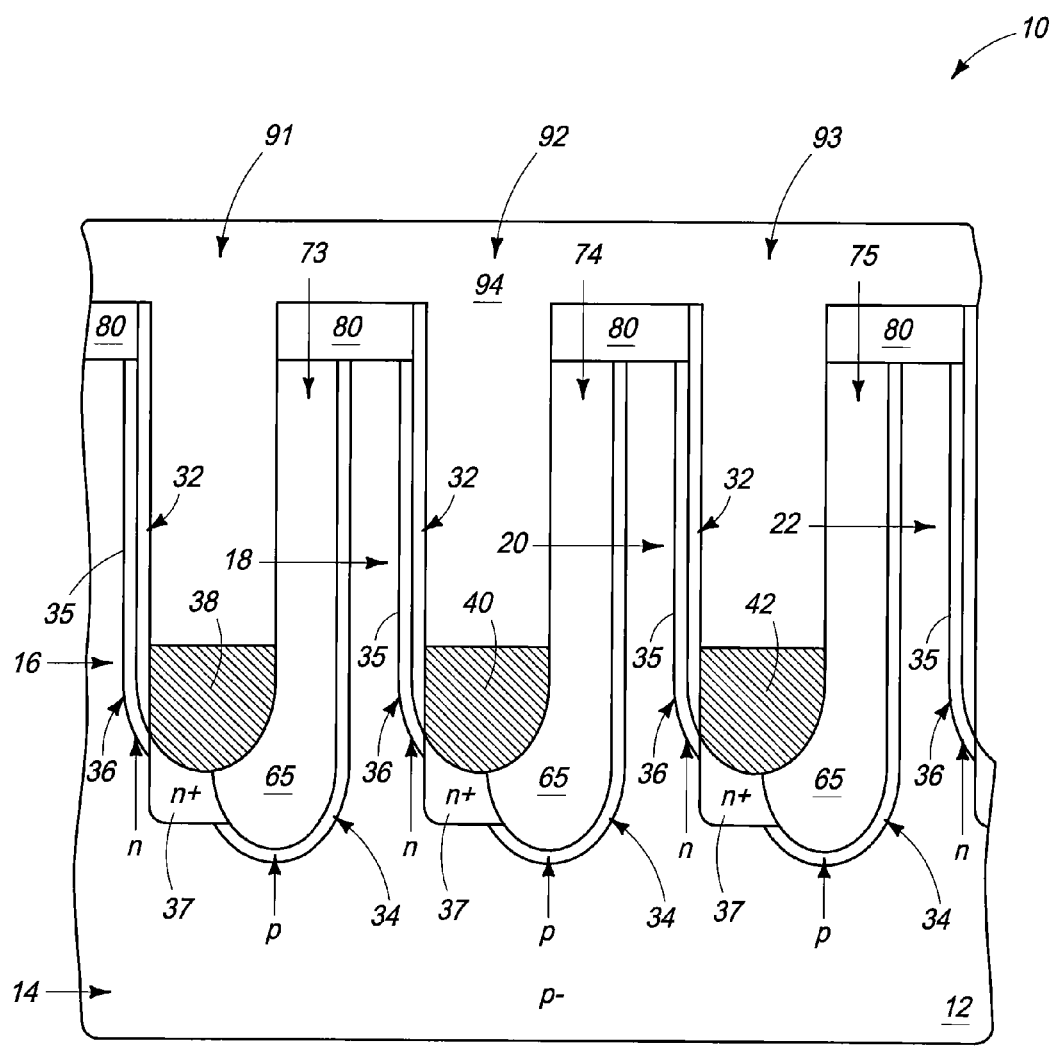

Referring to FIG. 10, dielectric material 94 is formed within the receptacles 91-93 to fill the receptacles. In the shown embodiment, the dielectric material 94 extends over a top of patterned masking material 80. Dielectric material 94 may comprise any suitable composition or combination of compositions, and in some embodiments may comprise silicon dioxide identical to the oxide of dielectric material 65.

Figure 11:
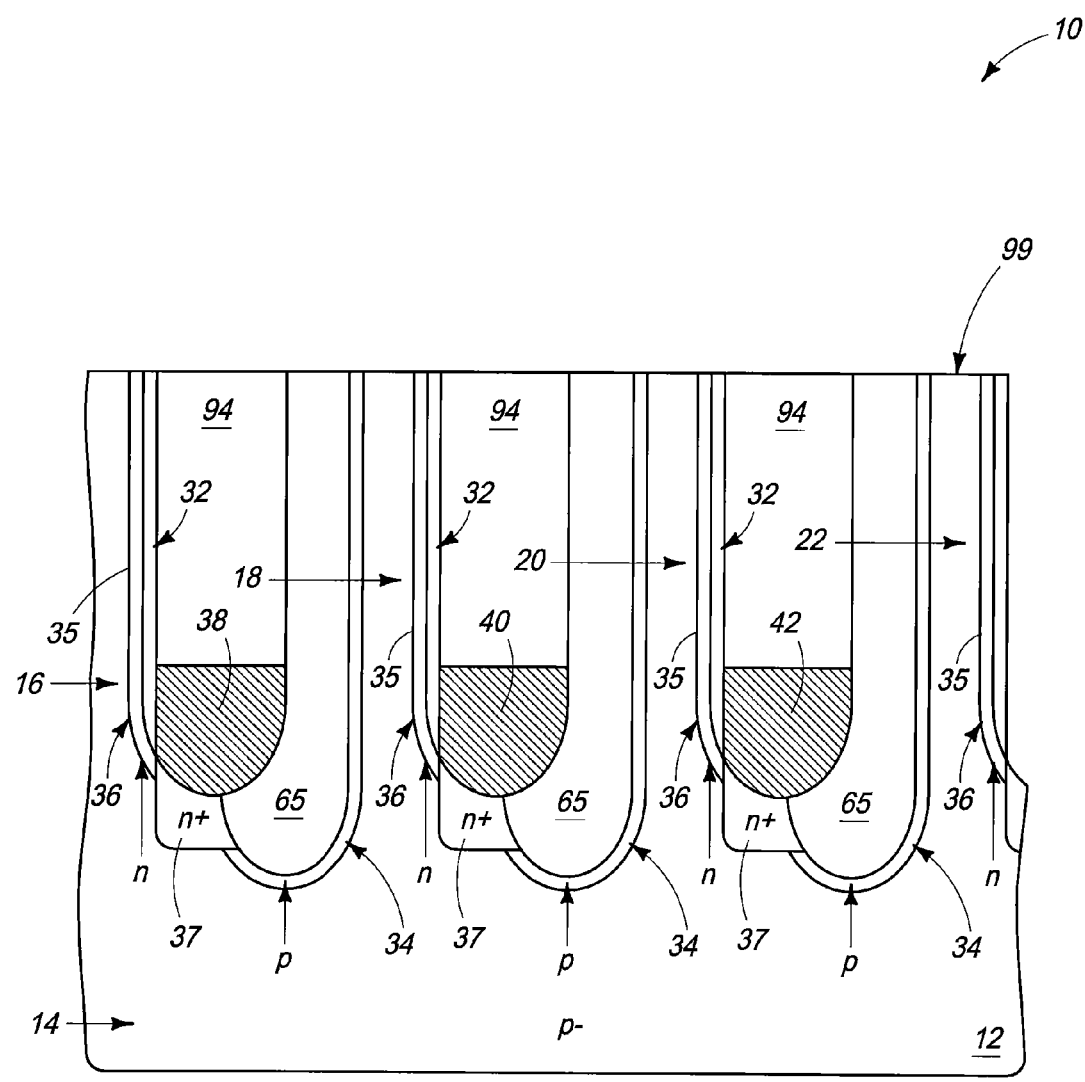

Referring to FIG. 11, construction 10 is shown after planarization (for instance, CMP) has been utilized to remove materials 80 and 94 from over an upper surface of semiconductor material 12, and to thus form a planarized upper surface 99.

Figure 12:
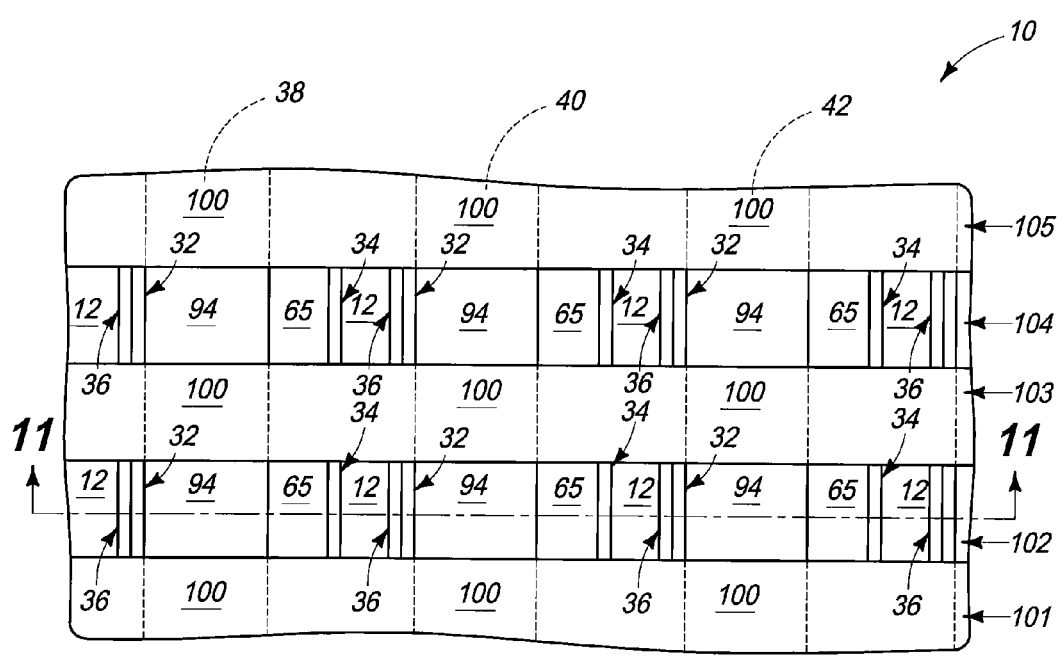
FIGS. 12 and 15 are top views of the semiconductor construction at the processing stages of FIGS. 11 and 14, respectively. The cross section of FIG. 11 is along the line 11-11 of FIG. 12, and at the cross-section of FIG. 14 is along the line 14-14 of FIG. 15.

The construction of FIG. 11 will ultimately be incorporated into a plurality of select devices. FIG. 12 shows a top view of the construction 10 at the processing stage of FIG. 11, and shows that the construction may be subdivided into a plurality of segments that ultimately are incorporated select devices (with a pair of example segments being shown as segments 102 and 104), and shows that such segments may be spaced from one another by dielectric material strips (with example dielectric material strips being shown as strips 101, 103 and 105). The dielectric material strips are shown filled with dielectric material 100. Such dielectric material may comprise any suitable composition or combination of compositions, and in some embodiments may comprise, consist essentially of, or consist of silicon dioxide.

The dielectric material strips may be formed at any suitable processing stage. For instance, the dielectric material strips may be formed subsequent to the formation of planarized upper surface 99 by forming a patterned mask (not shown) over such planarized surface to define locations for the dielectric material strips; etching into such locations to form openings that extend into material 12, but that do not penetrate through conductive interconnects 38, 40 and 42; filling the openings with dielectric material 100; and subsequently removing the mask and any excess dielectric material with appropriate planarization (for instance, CMP).

The conductive interconnects 38, 40 and 42 are shown in dashed-line view in FIG. 12 to indicate that such conductive interconnects are beneath other materials. The conductive interconnects extend through multiple select device-containing segments (for instance, segments 102 and 104), and thus electrically interconnect multiple select devices (and ultimately multiple NAND strings) across a memory array.

Figure 13:
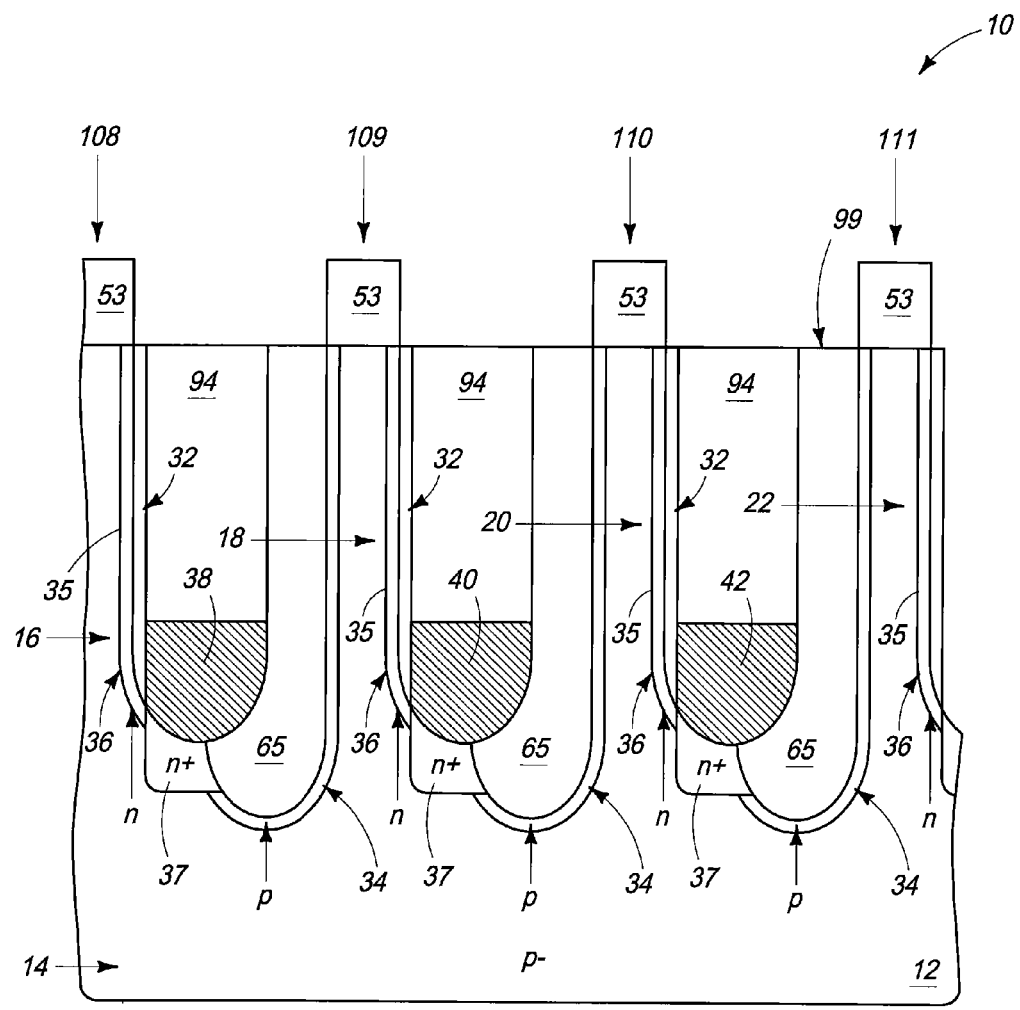
Figure 15:
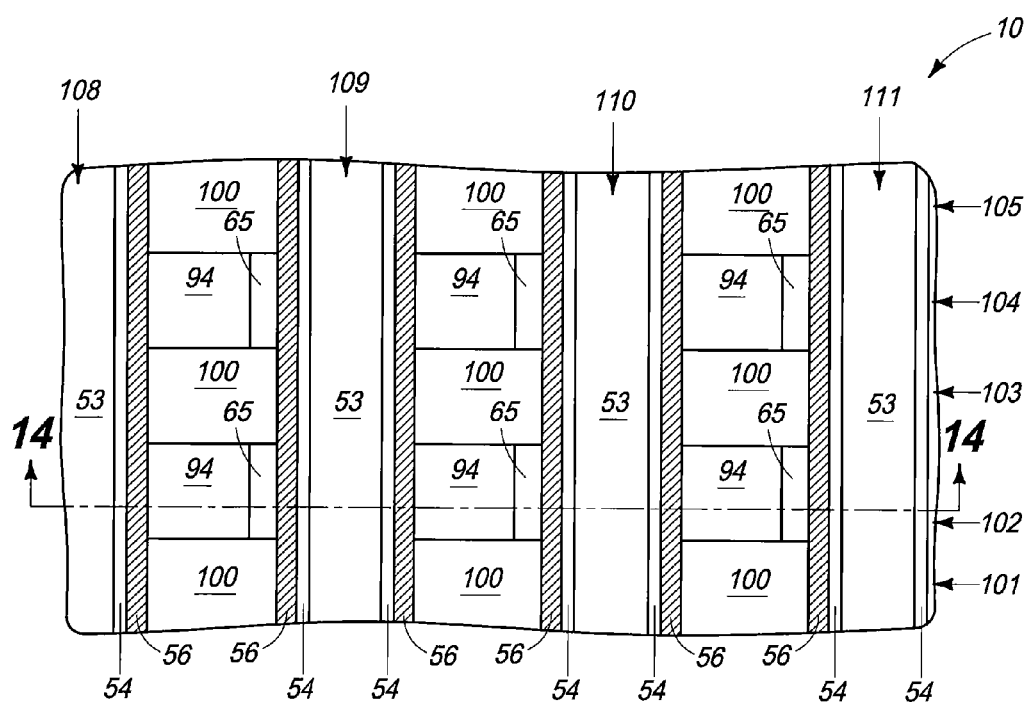

Referring to FIG. 13, patterned semiconductor material 53 is formed over planarized upper surface 99. The patterned semiconductor material is configured as lines 108-111 that extend in and out of the page relative to the shown cross-sectional view (as shown in FIG. 15), and that are provided on top of pillars 16, 18, 20 and 22. The semiconductor material 53 of such blocks is directly against semiconductor material 12 of the pillars.

The semiconductor material lines 108-111 may be formed with any suitable processing. For instance, semiconductor material may be deposited with one or both of ALD and CVD, and subsequently patterned into the shown lines utilizing a photolithographically-patterned mask (not shown) and appropriate etching.

Figure 14:
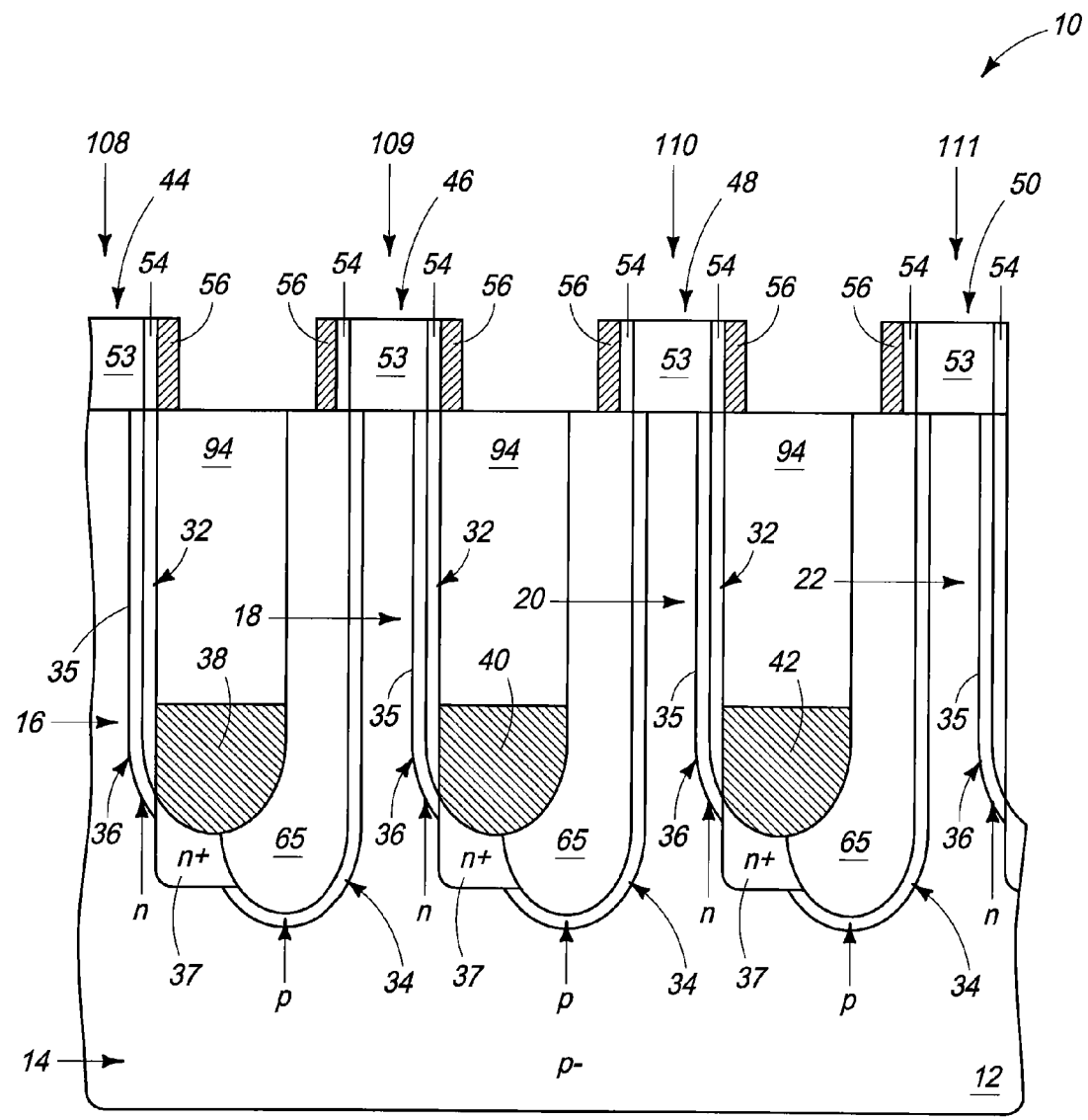

Referring to FIG. 14, gate dielectric 54 is formed along sidewalls of blocks 108-111, and subsequently electrically conductive gate lines 56 are formed along the gate dielectric material. The gate material 54 and gate lines 56 may be deposited and patterned utilizing any suitable processing. The patterned semiconductor material 53, together with gate dielectric material 54 and gate lines 56, form the select devices 44, 46, 48 and 50 that were discussed above with reference to FIG. 2.

In subsequent processing (not shown) vertical NAND strings of the type described above with reference to FIG. 2 may be formed over the select devices to incorporate the construction of FIG. 14 into a memory array construction analogous to that discussed above with reference to FIG. 2.

FIG. 15 shows a top view of FIG. 14. Such top view shows the semiconductor material lines 108-111, together with the associated gate dielectric 54 and gate lines 56, extending across the select device-containing segments 102 and 104, and across the dielectric material strips 101, 103 and 105.

An example method for forming the embodiment of FIG. 3 is described with reference to FIGS. 16-27.

Figure 16:
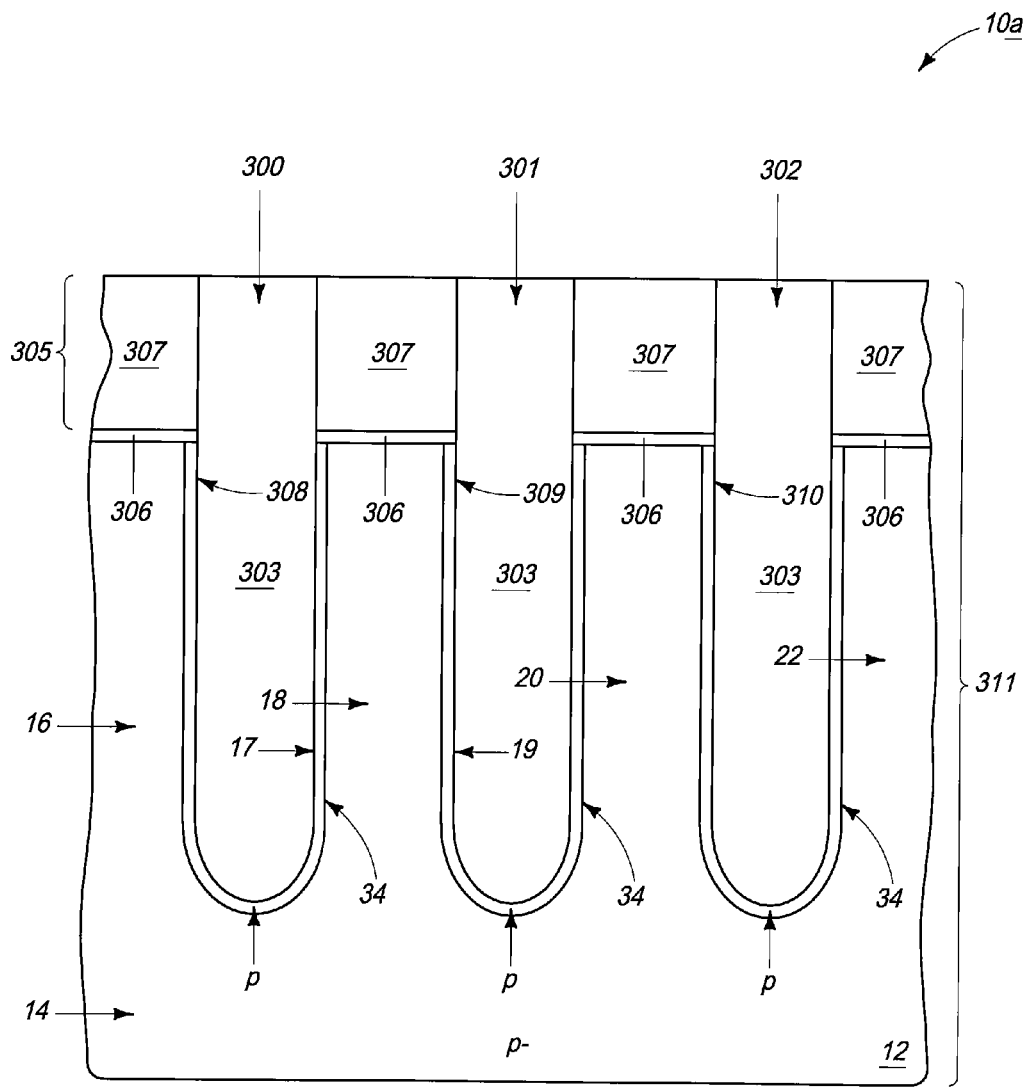
FIGS. 16-27 are diagrammatic cross-sectional views of a portion of a semiconductor construction illustrating stages of a process sequence for fabrication of a NAND memory construction analogous to that of FIG. 3.

Referring to FIG. 16, construction 10a is shown at a processing stage after a plurality of dielectric regions 300-302 are formed to extend into semiconductor material 12. The dielectric regions may be formed with any suitable processing. For instance, a patterned mask 305 comprising polysilicon 307 over silicon dioxide 306 may be formed over an upper surface of material 12 to define locations of openings, the openings may then be extended into material 12 with one or more suitable etches, dielectric material 303 may be formed within the openings, and finally CMP may be utilized to remove any excess dielectric material form over the mask.

Dielectric material 303 may comprise any suitable composition or combination of compositions, and in some embodiments may comprise, consist essentially of, or consist of silicon dioxide.

After formation of dielectric regions 300-302, semiconductor material 12 has a configuration which includes the base 14, and the vertically-extending pillars 16, 18, 20 and 22 extending upwardly from such base. Each of the pillars has a pair of opposing vertically-extending sides (for instance, the sides 17 and 19 of pillar 18) along the cross-section of the view of FIG. 16. The opposing sides of an individual pillar may be referred to as a first side and a second side in the discussion that follows.

P-type regions 34 are shown formed within semiconductor material 12 along the peripheries of the dielectric regions 300-302. The p-type regions may be formed by implanting p-type material (for instance, boron) into the semiconductor material after the openings are formed in the semiconductor material for the dielectric regions, and prior to deposition of dielectric material 303.

In some embodiments each of the dielectric regions 300-302 may be considered to be paired with an adjacent pillar, with such pairs corresponding to pillar 16/dielectric region 300, pillar 18/dielectric region 301, and pillar 20/dielectric region 302. The pillar/dielectric region pairs comprise pillar/dielectric region interfaces 308-310 where the pillars and dielectric regions are directly adjacent one another.

The masking material 305, dielectric regions 300-302, and material 12 may be considered to form a substrate 311.

Figure 17:
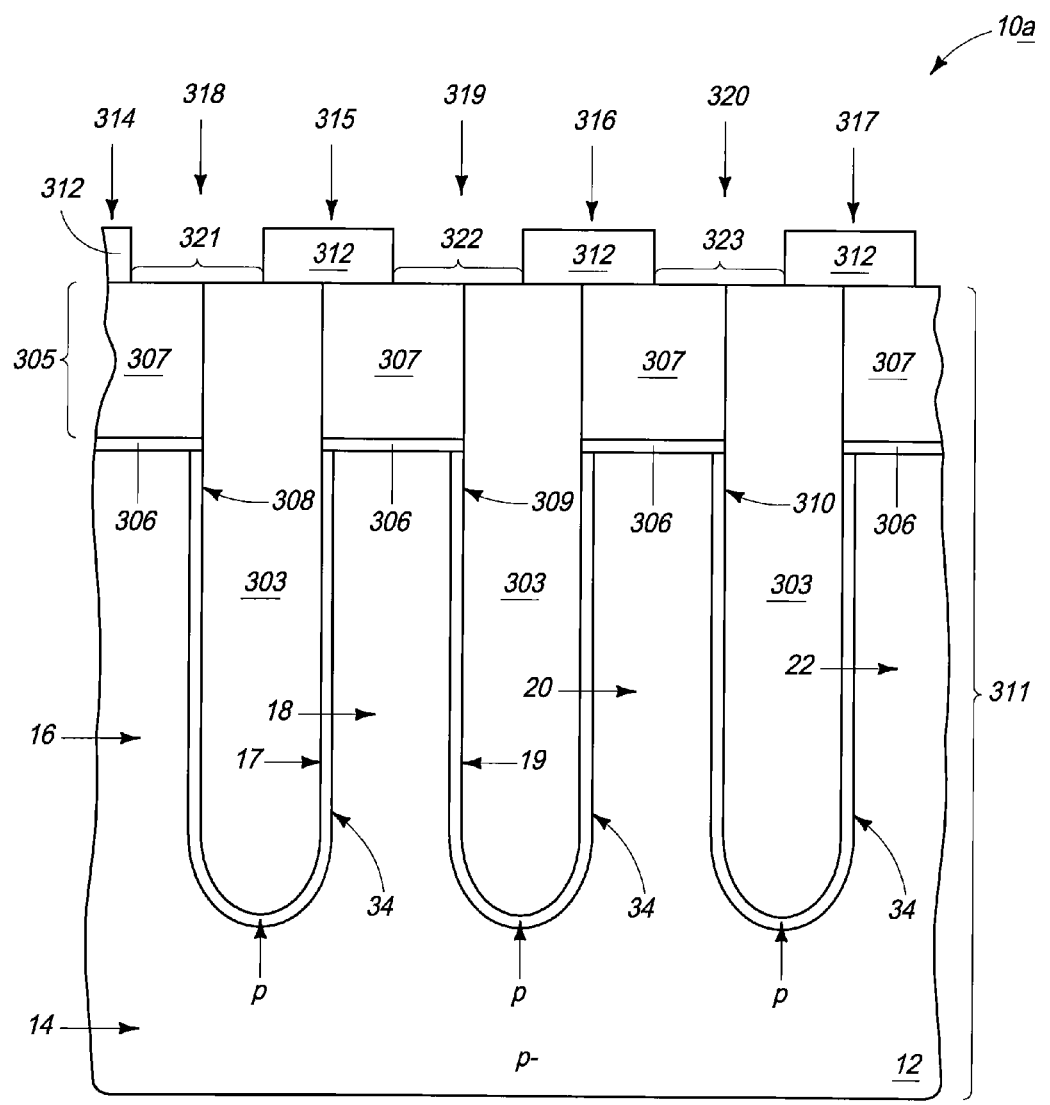

Referring to FIG. 17, a patterned mask of masking material 312 is formed over substrate 311. The patterned mask comprises a plurality of features 314-317, and comprises gaps 318-320 between the features. Segments 321-323 of substrate 311 are exposed within gaps 318-320, with such segments being directly over the pillar/dielectric region interfaces 308-310. Masking material 312 may comprise any suitable composition or combination of compositions. In subsequent processing, materials 12 and 303 are selectively removed relative to masking material 312, and accordingly it can be desired that material 312 comprise a composition to which material 12 and silicon dioxide material 303 are selectively etchable. In some embodiments dielectric material 303 comprises a low density oxide, and masking material 312 comprises high-density oxide (for instance, oxide formed from tetraethyl orthosilicate).

Figure 18:
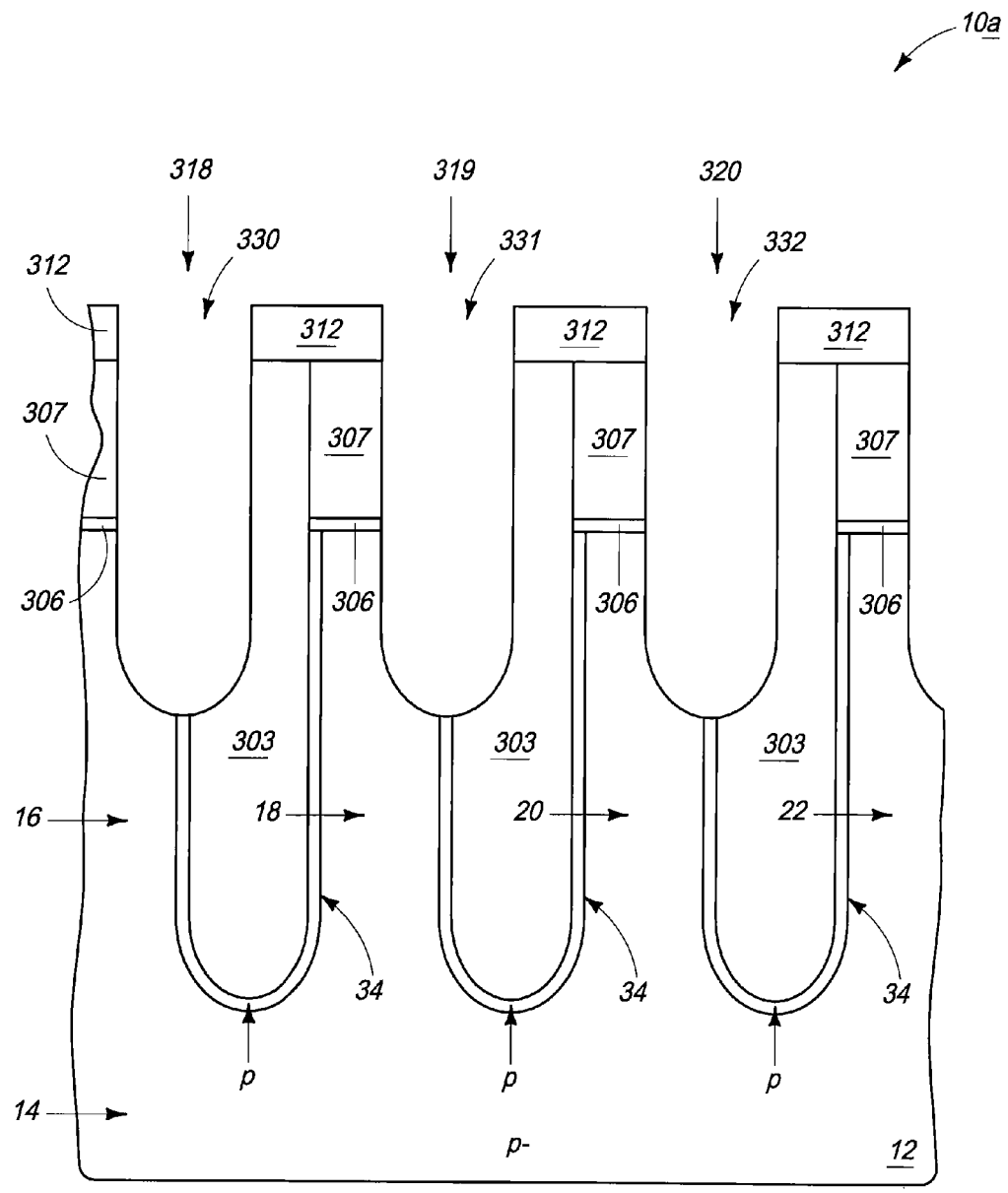

Referring to FIG. 18, gaps 318-320 are extended into materials 12, 303, 306 and 307 with a first etch. The first etch is substantially non-selective between materials 12, 303, 306 and 307. The first etch forms openings 330-332, and such openings extend into locations previously occupied by pillar/dielectric region interfaces 308-310 (FIG. 17).

Figure 19:
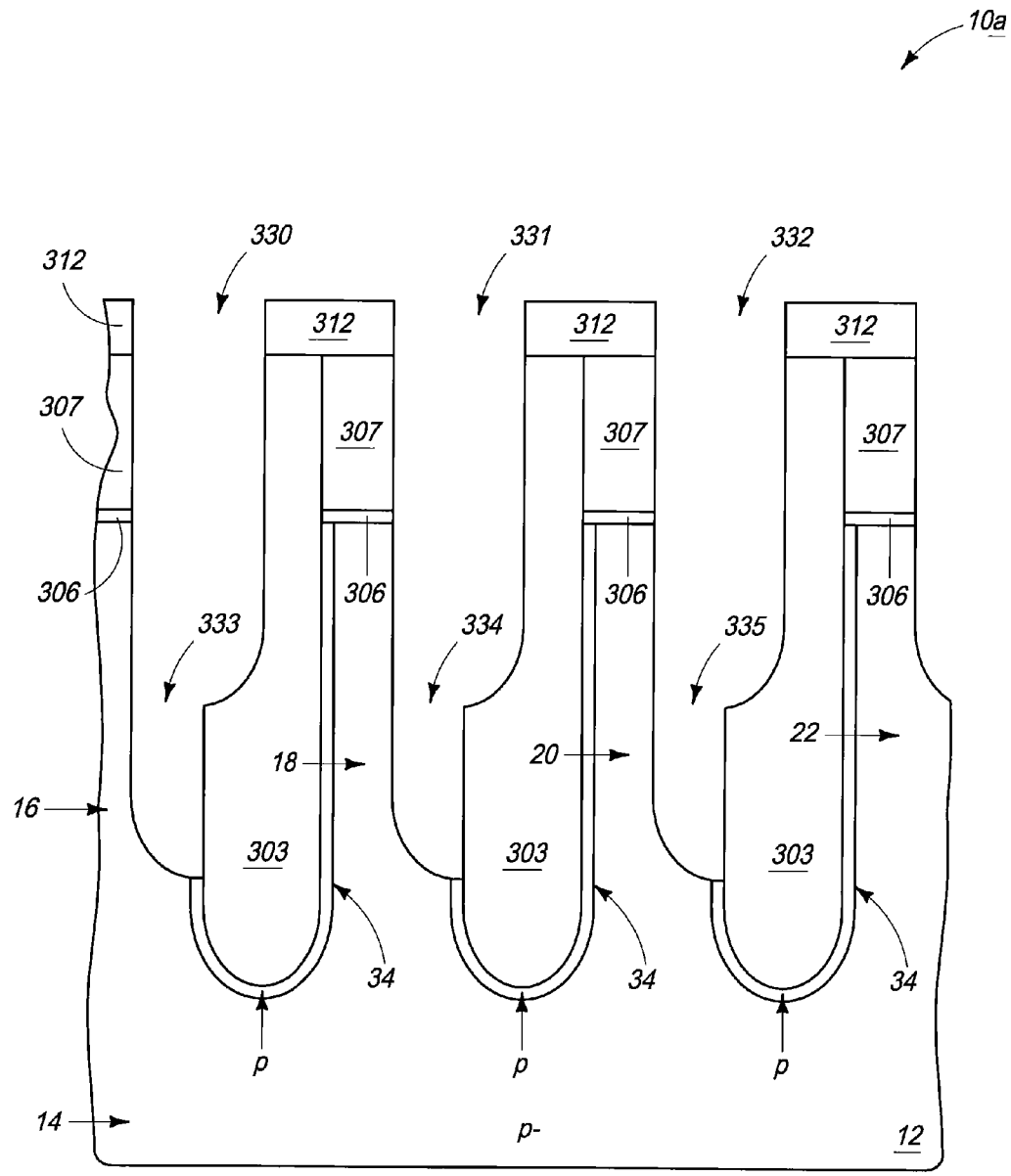

Referring to FIG. 19, additional etching is utilized to further extend openings 330-332 into semiconductor material 12. The additional etching is selective for semiconductor material 12 relative to materials 303, 306, 307 and 312, and thus forms narrow extensions 333-335 at the bottoms of openings 330-332.

Figure 20:
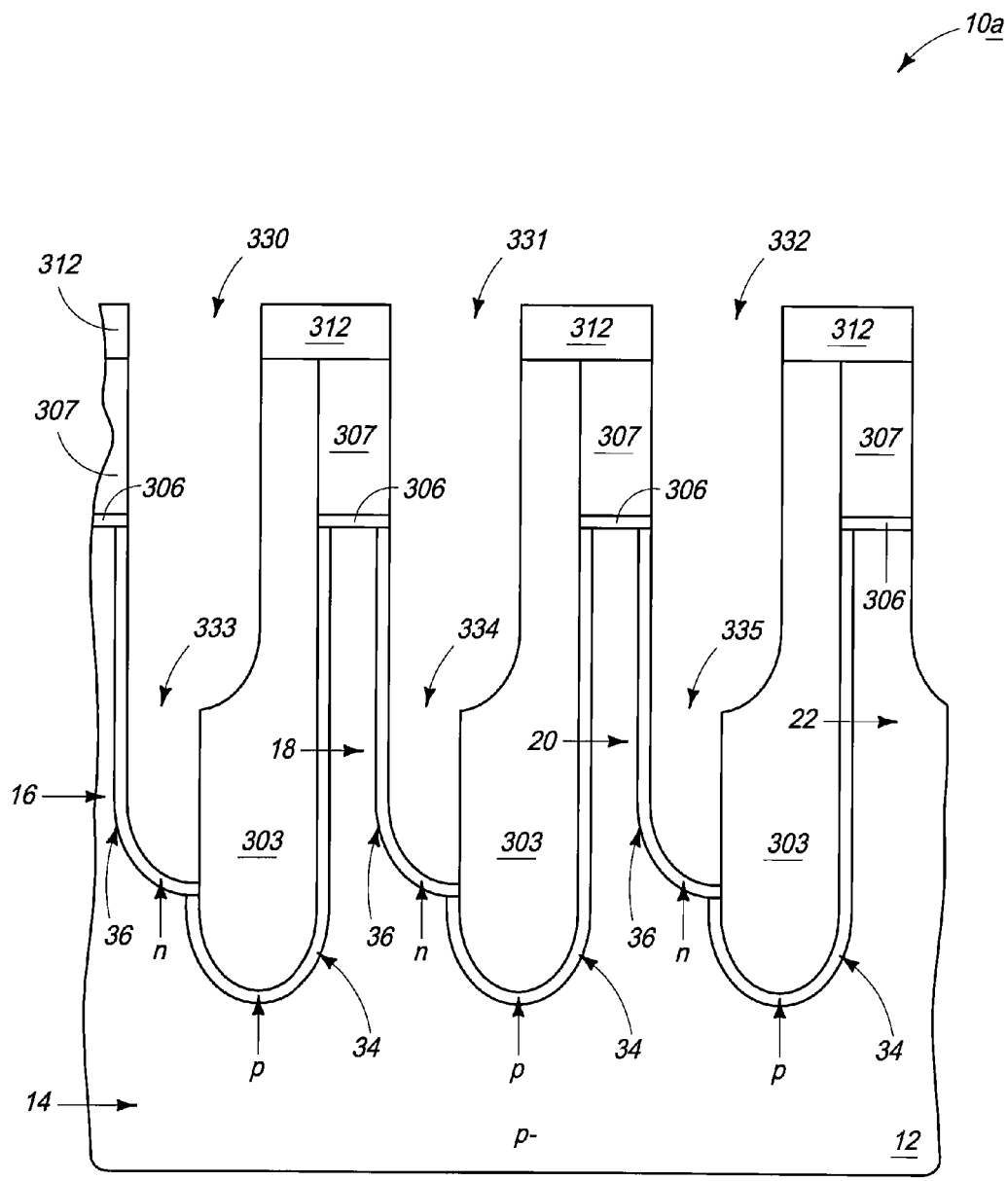

Referring to FIG. 20, n-type dopant is implanted along sidewalls of the openings 330-332 to form n-type doped regions 36. The n-type dopant may be any suitable dopant, such as, for example, phosphorus and/or arsenic.

Figure 21:
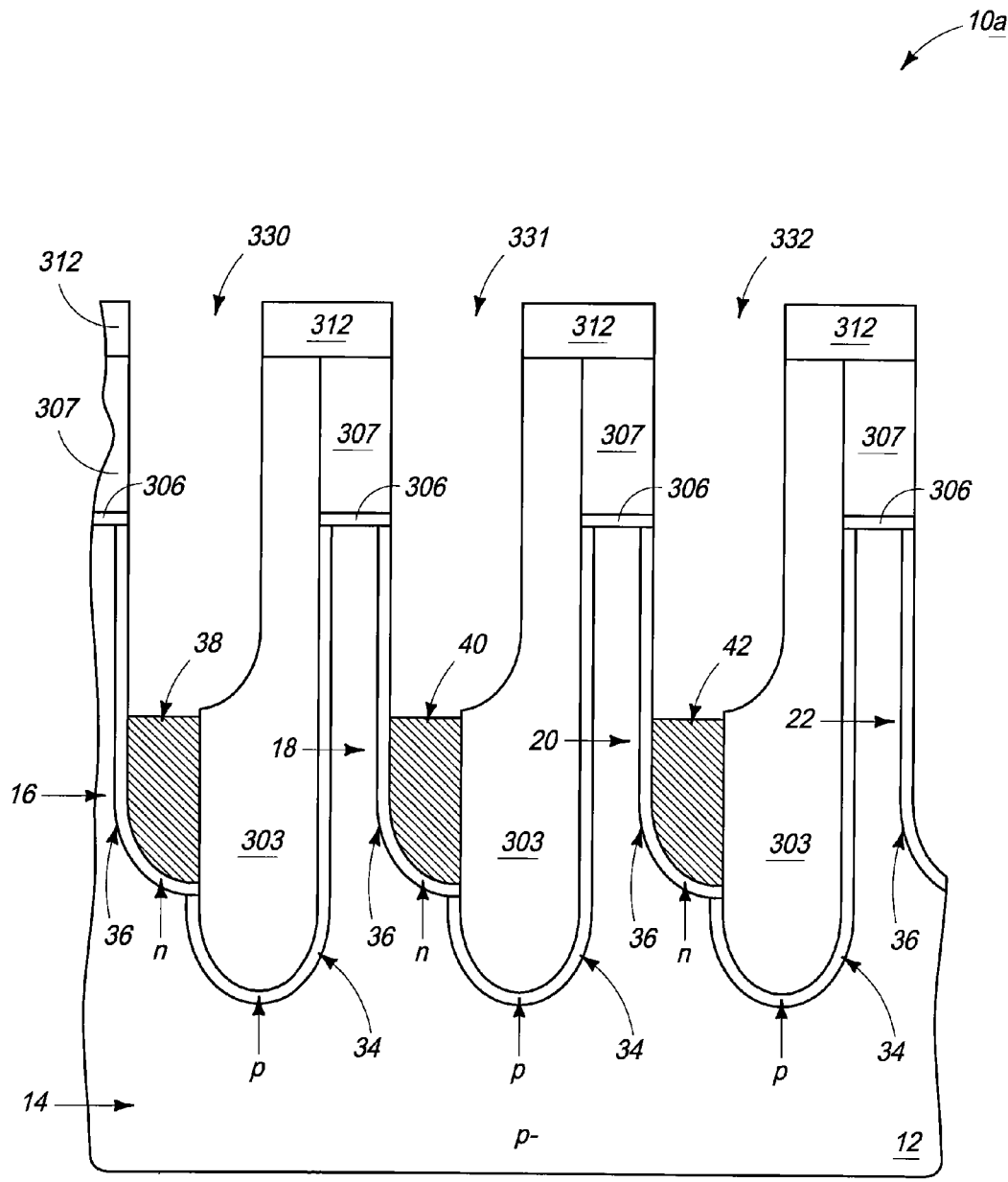

Referring to FIG. 21, electrically conductive interconnect lines 38, 40 and 42 are formed at the bottoms (or bases) of openings 330-332.

Figure 22:
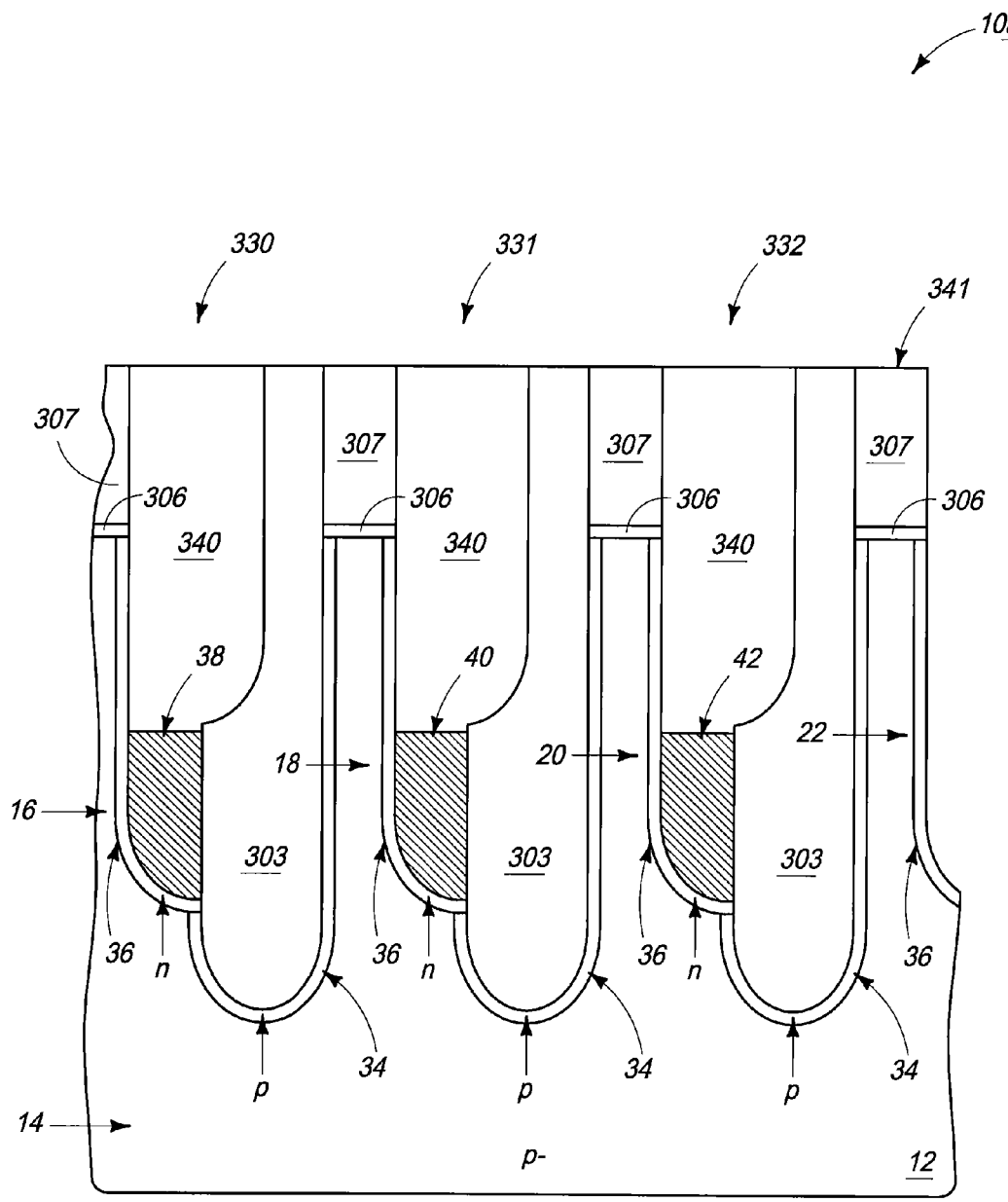

Referring to FIG. 22, dielectric material 340 is formed within the openings 330-332, and then planarization is conducted to remove masking material 312 (FIG. 21) and any excess material 340, and to form the shown planarized upper surface 341.

Figure 23:
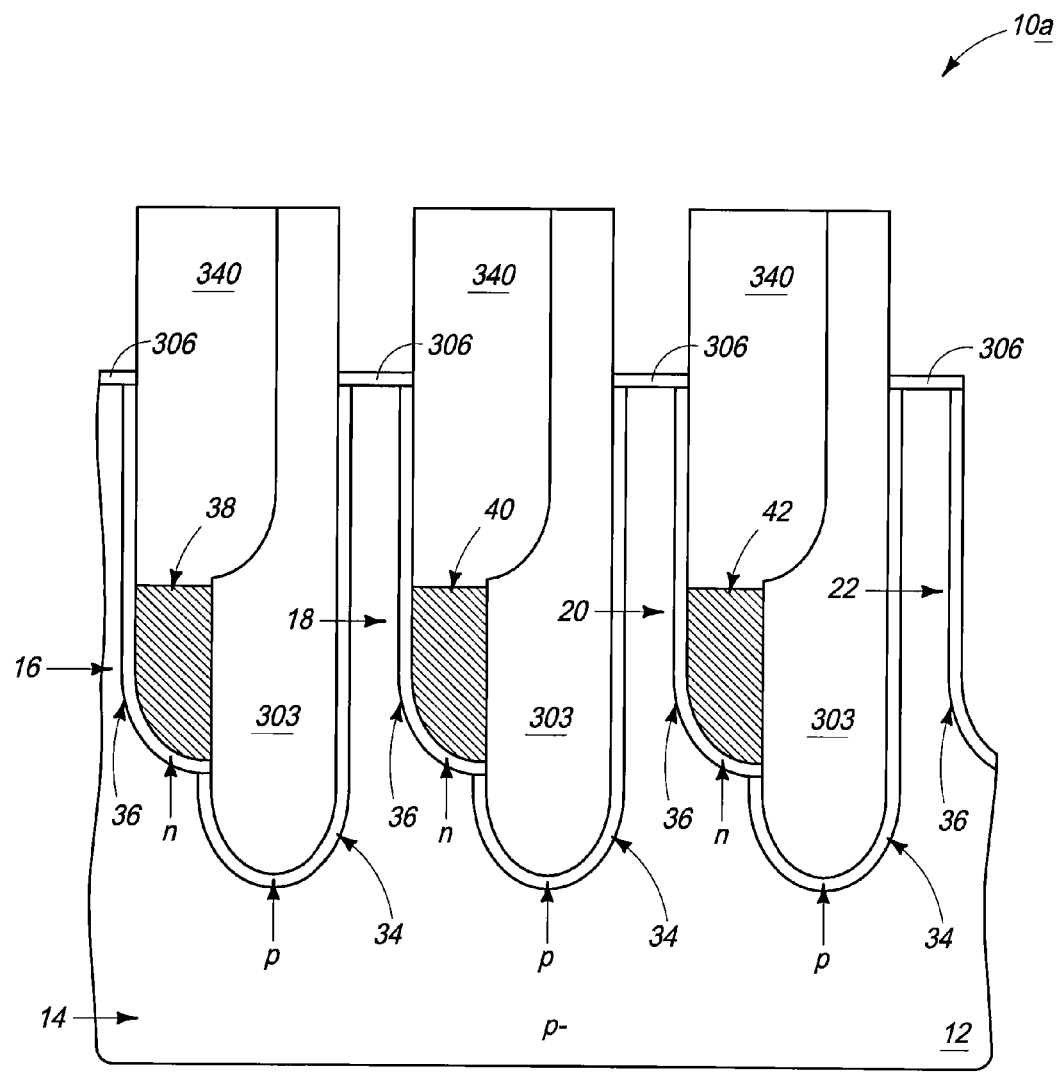

Referring to FIG. 23, material 307 (FIG. 22) is selectively removed relative to materials 303, 306 and 340. In embodiments in which material 307 consists of polysilicon, and materials 303, 306 and 340 consist of silicon dioxide, the material 307 may be selectively removed relative to materials 303, 306 and 340 utilizing tetramethyl ammonium hydroxide (TMAH).

Figure 24:
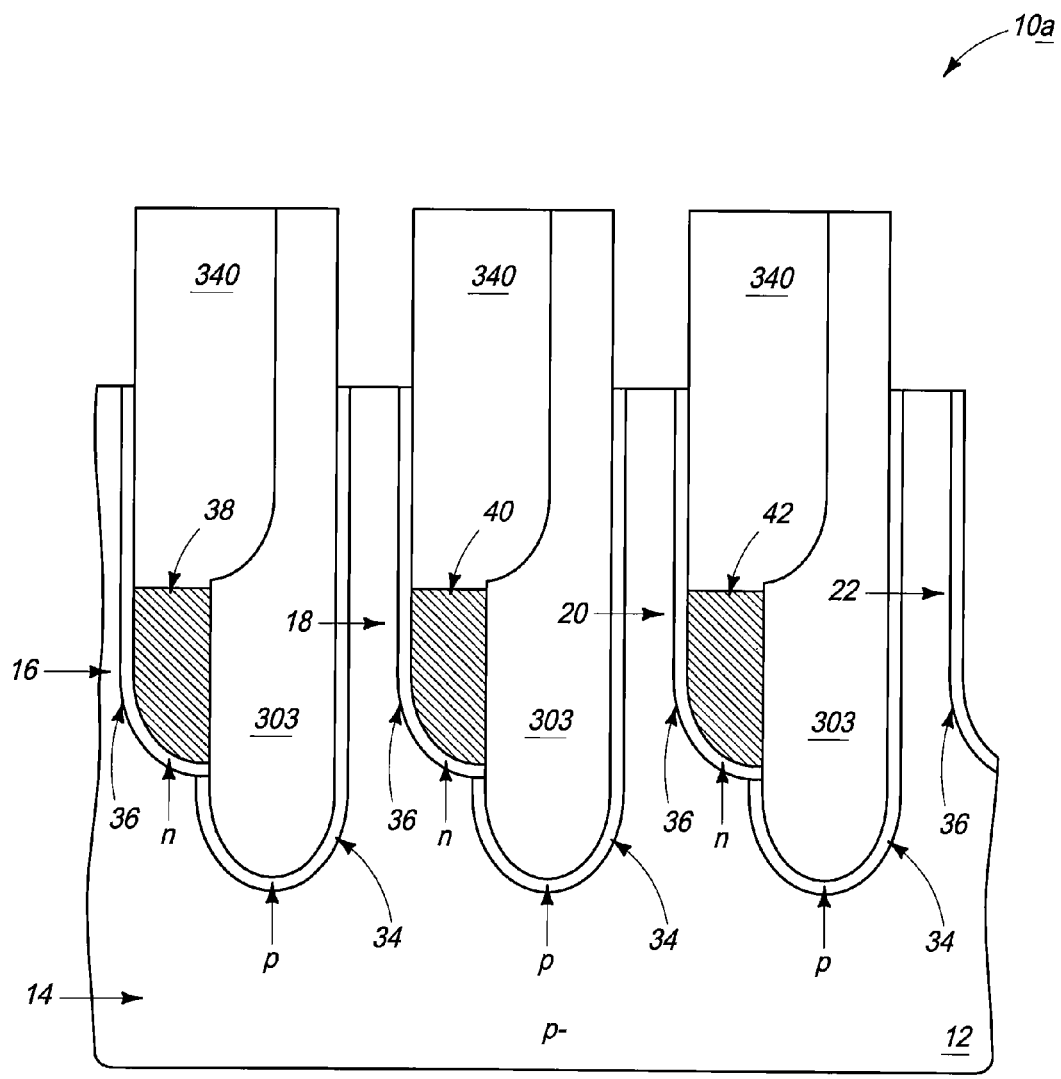

Referring to FIG. 24, material 306 (FIG. 23) is removed. In embodiments in which materials 306, 303 and 340 all consist of silicon oxide, the removal of material 306 may be substantially nonselective relative to materials 303 and 340. However, the removal of material 306 may be conducted with a timed etch so that it is primarily only the thin material 306 which is removed. Any suitable etch may be used for removing material 306, including, for example, an etch utilizing one or both of HF and HCl.

Figure 25:
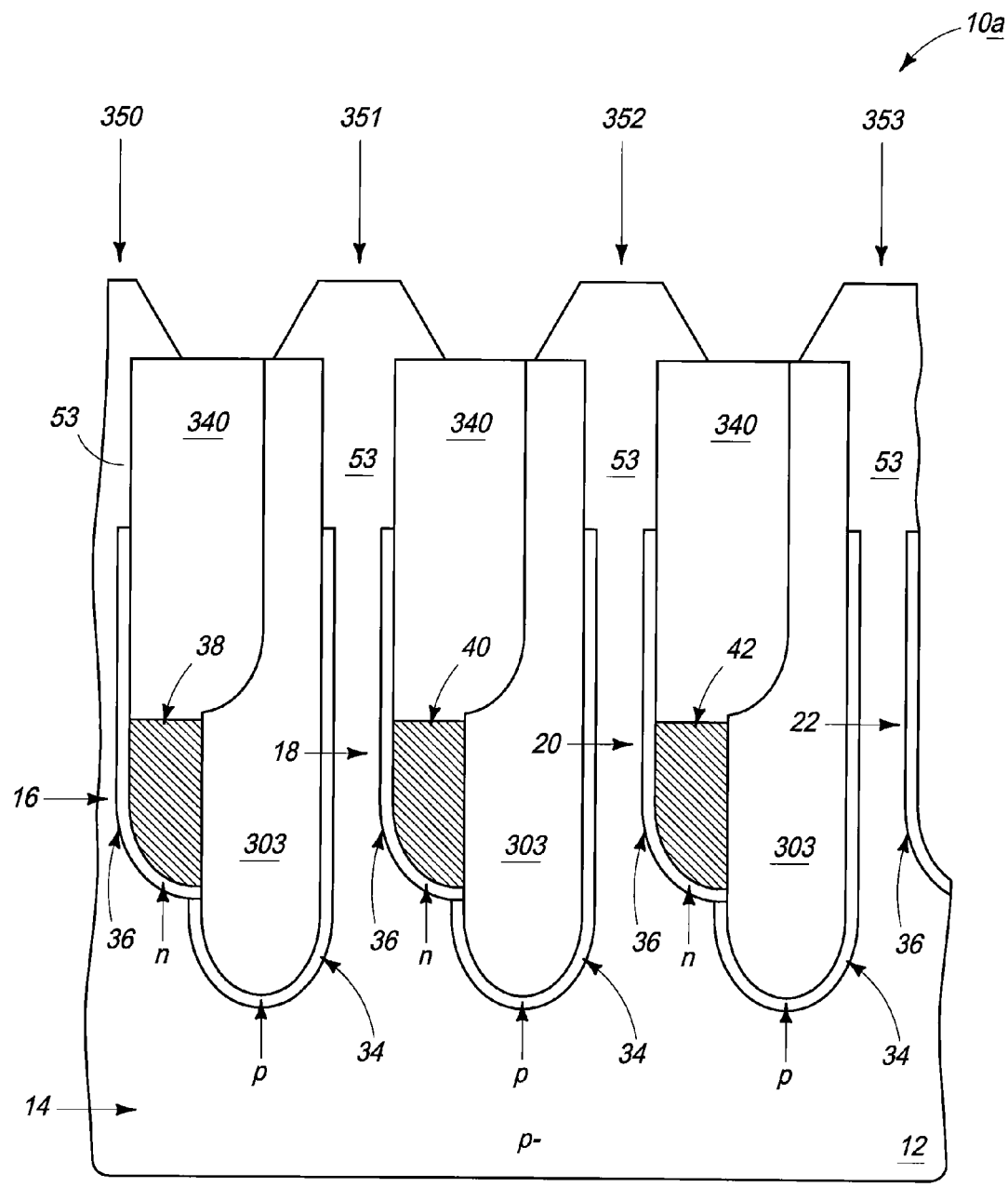

Referring to FIG. 25, semiconductor material 53 is epitaxial grown from the semiconductor material 12 of pillars 16, 18, 20 and 22 to form a plurality of pedestals 350-353 over such pillars. In embodiments in which semiconductor material 12 comprises monocrystalline silicon, the epitaxial growth of material 53 may comprise growth of in situ lightly doped monocrystalline silicon (for instance, growth of in situ (p−) doped monocrystalline silicon). The epitaxially-grown material may be chopped in locations outside of the plane of FIG. 26, and then isolation regions analogous to the regions 101, 103 and 105 of FIG. 12 may be formed in such locations.

Figure 26:
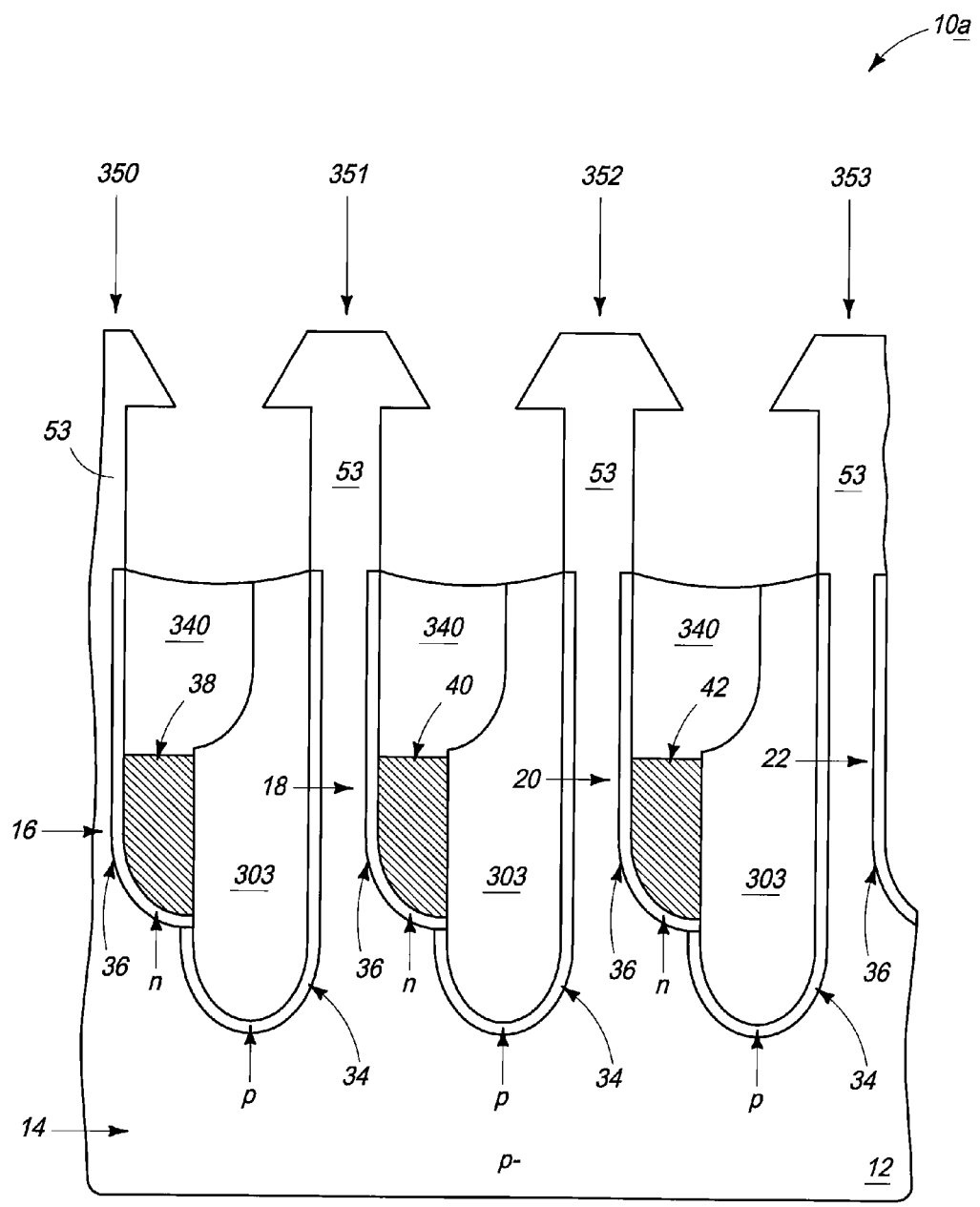

Referring to FIG. 26, materials 303 and 340 are selectively etched relative to epitaxial-grown silicon 53. In embodiments in which materials 303 and 340 comprise silicon dioxide, such etch may comprise an initial oxide dry etch, followed by an isotropic etch.

Figure 27:
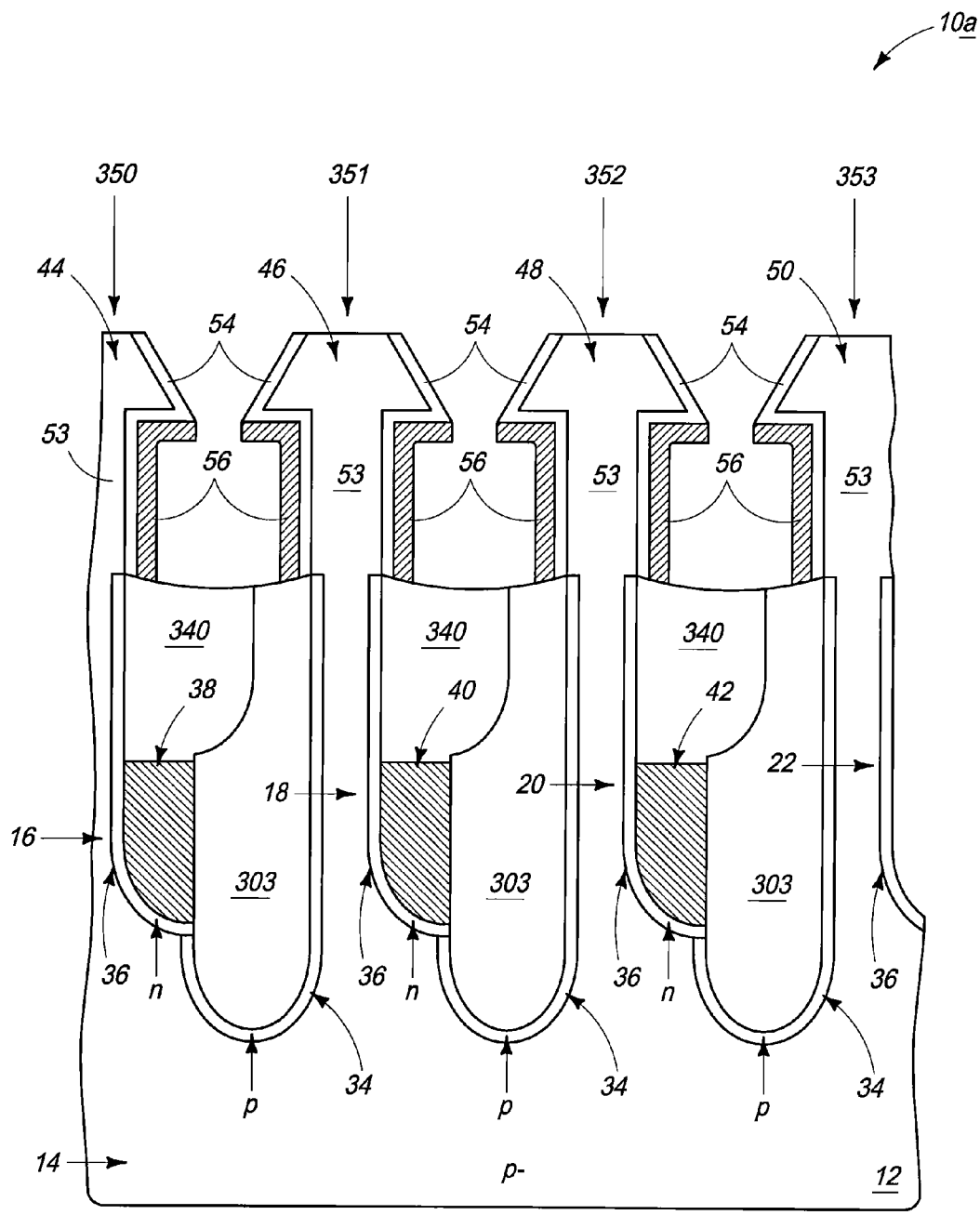

Referring to FIG. 27, gate dielectric 54 is formed along sidewalls of pedestals 350-353, and subsequently the electrically conductive gate lines 56 are formed along the gate dielectric material. The dielectric material 54 and gate lines 56 may be deposited and patterned utilizing any suitable processing. The patterned semiconductor material 53, together with gate dielectric material 54 and gate lines 56 form the select devices 44, 46, 48 and 50 that were discussed above with reference to FIG. 3. The gate material 56 and dielectric material 54 may be along only two opposing sides of the pedestals (as shown in the cross-sectional view of FIG. 27), or may surround the pedestals in gate all around constructions.

In subsequent processing (not shown) vertical NAND strings of the type described above with reference to FIG. 3 may be formed over the select devices to incorporate the construction of FIG. 27 into a memory array construction analogous that discussed above with reference to FIG. 3.

The embodiments discussed above may be used to form integrated memory arrays. Such arrays may be incorporated into chip packages, and may ultimately be utilized in electronic systems, such as, for example, computers, cars, airplanes, clocks, cellular phones, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some of the figures show various different dopant levels, and utilize some or all of the designations p+, p, p−, n−, n and n+ to distinguish the levels. The difference in dopant concentration between the regions identified as being p+, p, and p− are as follows. A p+ region has a dopant concentration of at least about $10^{20}$ atoms/cm$^3$, a p region has a dopant concentration of from about $10^{14}$ to about $10^{18}$ atoms/cm$^3$, and a p− region has a dopant concentration in the order of or less than $10^{16}$ atoms/cm$^3$. It is noted that regions identified as being n−, n and n+ will have dopant concentrations similar to those described above relative to the p−, p and p+ regions respectively, except, of course, the n regions will have an opposite-type conductivity enhancing dopant therein than do the p regions. It is noted that the terms "p" and "n" can be utilized herein to refer to both dopant type and relative dopant concentrations. The terms "p" and "n" are to be understood as referring only to dopant type, and not to a relative dopant concentration, except when it is explicitly stated that the terms refer to relative dopant concentrations. Accordingly, for purposes of interpreting this disclosure and the claims that follow, it is to be understood that the term "p-type doped" and n-type doped" refer to dopant types of a region and not to relative dopant levels. Thus, a p-type doped region can be doped to any of the p+, p, and p− dopant levels discussed above, and similarly an n-type doped region can be doped to any of the n+, n, and n− dopant levels discussed above.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A NAND memory construction, comprising:
dielectric regions extending into a semiconductor material, the semiconductor material comprising pillars extending upwardly between the dielectric regions; individual pillars having a pair of opposing vertically-extending sides along a cross-section, said opposing vertically-extending sides being a first side and a second side;
electrically conductive interconnect lines along and directly against the dielectric regions, the interconnect lines extending primarily along a horizontal direction;
first conductivity type regions within the semiconductor material pillars along the first sides of the individual pillars within the semiconductor material; the first conductivity type regions being directly against first portions of the dielectric regions;
second conductivity type regions within the semiconductor material pillars along the second sides of the individual pillars; the second conductivity type regions being directly against second portions of the dielectric regions and directly contacting the interconnect lines;
a plurality of vertical NAND strings over the pillars; and
select devices selectively coupling the NAND strings with the interconnect lines, the select devices having vertical channels directly against the semiconductor material pillars and directly against upper regions of the first and second conductivity type regions, the vertical channels having a pair of opposing vertically-extending sides along the cross-section, and having electrically conductive gate lines along said opposing sides and spaced from the vertical channels by gate dielectric material.

2. The NAND memory construction of claim 1 wherein the interconnect lines comprise metallic material and are common source lines that interconnect multiple NAND strings with one another.

3. The NAND memory construction of claim 1 wherein the first conductivity type regions are n-type regions and wherein the second conductivity type regions are p-type regions.

4. The NAND memory construction of claim 1 wherein the first conductivity type regions are p-type regions and wherein the second conductivity type regions are n-type regions.

5. The NAND memory construction of claim 1 wherein the select device channel regions extend to a first height over the pillars, and wherein the electrically conductive gate lines extend to a height over the pillars that is about the same as the first height.

6. The NAND memory construction of claim 1 wherein the semiconductor material of the pillars is a first semiconductor material; wherein the select device channel regions are within second semiconductor material that extends to a first height over the pillars, wherein the electrically conductive gate lines extend to a height over the pillars that less than the first height; and wherein the second semiconductor material extends laterally over uppermost surfaces of the of the electrically conductive gate lines.

7. The NAND memory construction of claim 1 wherein individual second conductivity type regions comprise two segments, with a first of the two segments being more heavily doped than a second of the two segments; wherein the first segments are directly under the interconnect lines and in direct contact with the interconnect lines, and wherein the second segments are along said second sides of the individual pillars and extend from the vertical channels of the select devices to the first segments.

8. The NAND memory construction of claim 1 wherein individual second conductivity type regions consist of a single segment, wherein individual interconnect lines have side surfaces and bottom surfaces along the cross-section; and wherein said single segments directly contacting both the side surfaces and the bottom surfaces of the individual interconnect lines.

9. A NAND memory construction, comprising:
a substrate having monocrystalline semiconductor material configured as a base with numerous pillars extending upwardly therefrom, the pillars having valleys between them; individual pillars having a pair of opposing vertically-extending sides along a cross-section, said opposing vertically-extending sides being a first side and a second side; the first sides of the pillars being of a first conductivity type, and the second sides of the pillars being of a second conductivity type;
interconnect lines within the valleys and directly against the second-conductivity-type second sides;
vertical NAND strings over the pillars; and
select devices selectively coupling the NAND strings with the interconnect lines, the select devices being over the monocrystalline semiconductor pillars and having vertical channels directly against the monocrystalline semiconductor material pillars, the vertical channels having a pair of opposing vertically-extending sides along the cross-section, and having electrically conductive gate lines along said opposing sides and spaced from the vertical channels by gate dielectric material.

10. The NAND memory construction of claim 9 wherein the monocrystalline semiconductor material is monocrystalline silicon.

11. The NAND memory construction of claim 9 wherein the monocrystalline semiconductor material of the pillars is first monocrystalline semiconductor material, and wherein the vertical channels are within second monocrystalline semiconductor material.

12. The NAND memory construction of claim 11 wherein the second monocrystalline semiconductor material extends at least partially across uppermost surfaces of the gate lines.

13. The NAND memory construction of claim 11 wherein the second monocrystalline semiconductor material extends entirely across uppermost surfaces of the gate lines.

14. The NAND memory construction of claim 9 wherein the vertical channels are within semiconductor material that is polycrystalline and/or amorphous.

15. The NAND memory construction of claim 9 further comprising silicon dioxide within the valleys and over the interconnect lines.

16. The NAND memory construction of claim 9 wherein the first conductivity type is n-type and wherein the second conductivity type is p-type region.

17. The NAND memory construction of claim 9 wherein the first conductivity type is p-type and wherein the second conductivity type regions is n-type.

* * * * *

UNITED STATES PATENT AND TRADEMARK OFFICE
CERTIFICATE OF CORRECTION

PATENT NO. : 8,254,173 B2  Page 1 of 1
APPLICATION NO. : 12/872803
DATED : August 28, 2012
INVENTOR(S) : Sanh D. Tang It is certified that error appears in the above-identified patent and that said Letters Patent is hereby corrected as shown below:

In column 12, line 50, in Claim 6, after "of the" delete "of the".

Signed and Sealed this
Sixth Day of November, 2012

David J. Kappos
*Director of the United States Patent and Trademark Office*